US012787508B2

(12) United States Patent
Miyazaki

(10) Patent No.: US 12,787,508 B2
(45) Date of Patent: Nov. 3, 2026

(54) SEMICONDUCTOR LIGHT EMITTING DEVICE

(71) Applicant: ROHM Co., LTD., Kyoto (JP)

(72) Inventor: Dai Miyazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 915 days.

(21) Appl. No.: 18/177,923

(22) Filed: Mar. 3, 2023

(65) Prior Publication Data

US 2023/0282782 A1 Sep. 7, 2023

(30) Foreign Application Priority Data

Mar. 7, 2022 (JP) ................................ 2022-034614

(51) Int. Cl.

| | |
|---|---|
| ***H10H 20/85*** | (2025.01) |
| ***H10H 20/831*** | (2025.01) |
| ***H10H 20/854*** | (2025.01) |
| ***H10H 20/857*** | (2025.01) |

(52) U.S. Cl.

CPC .... *H10H 20/8506* (2025.01); *H10H 20/8312* (2025.01); *H10H 20/854* (2025.01); *H10H 20/857* (2025.01)

(58) Field of Classification Search

CPC combination set(s) only.

See application file for complete search history.

(56) References Cited

U.S. PATENT DOCUMENTS

| | | | | |
|---|---|---|---|---|
| 9,537,019 | B2 * | 1/2017 | Toyama | H10F 77/50 |
| 2018/0240948 | A1 * | 8/2018 | Nakanishi | H10H 20/854 |
| 2018/0269136 | A1 * | 9/2018 | Shoji | H10W 70/041 |
| 2019/0229247 | A1 * | 7/2019 | Taka | H10H 20/854 |
| 2020/0313050 | A1 * | 10/2020 | Toyama | H05K 3/363 |

FOREIGN PATENT DOCUMENTS

| | | | |
|---|---|---|---|
| JP | 2020-161697 | 10/2020 | |
| WO | WO-2010010890 A1 * | 1/2010 | H10H 20/8512 |

* cited by examiner

*Primary Examiner* — Mark W Tornow
*Assistant Examiner* — Priya M Rampersaud
(74) *Attorney, Agent, or Firm* — CHIP Law Group

(57) ABSTRACT

A semiconductor light emitting device includes a board including a first principal surface facing a first side in a thickness direction thereof, a first electrode provided on the board, a semiconductor light emitting element, and a light-transmitting resin that covers the element. The first electrode includes a first bonding portion and first, second, and third portions. The first bonding portion is formed on the first principal surface and is joined and electrically connected to the element. The first and second portions are each formed on the first principal surface and disposed on a first side in a first direction. The first portion is connected to the first bonding portion. The second portion is apart from the first bonding portion, and from the first portion in a second direction. The third portion is formed on a place different from the first principal surface, electrically connecting the first and second portions to each other.

22 Claims, 23 Drawing Sheets

SEMICONDUCTOR LIGHT EMITTING DEVICE

CROSS REFERENCE TO RELATED APPLICATIONS

This application claims priority benefit of Japanese Patent Application No. JP 2022-034614 filed in the Japan Patent Office on Mar. 7, 2022. Each of the above-referenced applications is hereby incorporated herein by reference in its entirety.

BACKGROUND

The present disclosure relates to a semiconductor light emitting device.

Semiconductor light emitting devices are widely used as light source devices for electronic devices or other devices. Japanese Patent Laid-open No. 2020-161697, hereinafter referred to as Patent Document 1, discloses an example of a known semiconductor light emitting device. The semiconductor light emitting device disclosed in Patent Document 1 includes a board, a semiconductor light emitting element, and a sealing resin. The board includes a principal surface, a first side surface, a second side surface, a bottom surface, and an upper surface. The principal surface faces one side in the thickness direction of the board. The first side surface and the second side surface face away from each other in a first direction perpendicular to the thickness direction of the board. The bottom surface and the upper surface face away from each other in a second direction perpendicular to both the thickness direction and the first direction. A first principal-surface electrode and a second principal-surface electrode are provided on the principal surface of the board. The first principal-surface electrode is disposed on one side in the first direction on the board, while the second principal-surface electrode is disposed on an opposite side in the first direction. The semiconductor light emitting element is mounted on the principal surface (more specifically, on the first principal-surface electrode). The sealing resin covers the semiconductor light emitting element and allows light coming from the semiconductor light emitting element to pass therethrough.

Each of the first principal-surface electrode and the second principal-surface electrode includes a portion that continuously extends in the second direction on the principal surface in such a manner as to adjoin both a side of the upper surface and a side of the bottom surface. The semiconductor light emitting device described in Patent Document 1 further includes a first insulating film and a second insulating film. The first insulating film is formed in such a manner as to cover portions of both the first principal-surface electrode and the principal surface and is covered by the sealing resin. The second insulating film is formed in such a manner as to cover portions of both the second principal-surface electrode and the principal surface and is covered by the sealing resin. When the semiconductor light emitting device is mounted on a circuit board, a solder for mounting the semiconductor light emitting device on the circuit board may intrude through a gap between the first principal-surface electrode (or the second principal-surface electrode) and the sealing resin and travel along the first principal-surface electrode (or the second principal-surface electrode). Such intrusion of the solder may cause a trouble such as an unwanted electrical connection. As such, when the semiconductor light emitting device is provided with the first insulating film and the second insulating film as described above, intrusion of the solder for the mounting will be blocked by the first insulating film (or the second insulating film) even if the solder intrudes through the gap between the first principal-surface electrode (or the second principal-surface electrode) and the sealing resin. This reduces the likelihood that the solder will intrude into a gap between the first principal-surface electrode (or the second principal-surface electrode) and the first insulating film (or the second insulating film), and contributes to preventing a trouble such as an unwanted electrical connection. However, when the first insulating film (or the second insulating film) is formed on the first principal-surface electrode (or the second principal-surface electrode) and the principal surface, areas in which the first principal-surface electrode (or the second principal-surface electrode) and the first insulating film (or the second insulating film) are individually formed are required when viewed in the thickness direction of the board. This is not desirable for reducing the size of the semiconductor light emitting device.

SUMMARY

The present disclosure has been conceived in view of the above-described circumstances, and it is desirable to provide a semiconductor light emitting device that is able to achieve a reduction in size and which is able to minimize the likelihood of a trouble due to intrusion of a solder.

A semiconductor light emitting device according to an embodiment of the present disclosure includes a board including a first principal surface facing a first side in a thickness direction thereof and a second principal surface facing a second side in the thickness direction, a first electrode provided on the board, a semiconductor light emitting element mounted on the first principal surface, and a light-transmitting resin that covers the semiconductor light emitting element. The first electrode includes a first bonding portion, a first portion, a second portion, and a third portion. The first bonding portion is formed on the first principal surface and is joined and electrically connected to the semiconductor light emitting element. Each of the first portion and the second portion is formed on the first principal surface and is disposed on a first side in a first direction perpendicular to the thickness direction on the board. The first portion is connected to the first bonding portion on the first principal surface. The second portion is apart from the first bonding portion on the first principal surface and is apart from the first portion in a second direction perpendicular to both the thickness direction and the first direction. The third portion is formed on a place different from the first principal surface. The first portion and the second portion are electrically continuous with each other through the third portion.

The semiconductor light emitting device according to an embodiment of the present disclosure is able to achieve a reduction in size and minimize the likelihood of a trouble due to intrusion of a solder.

Other features and advantages of the present disclosure will become more apparent from the detailed description provided below with reference to the accompanying drawings.

DETAILED DESCRIPTION OF THE PREFERRED EMBODIMENTS

Figure 1:
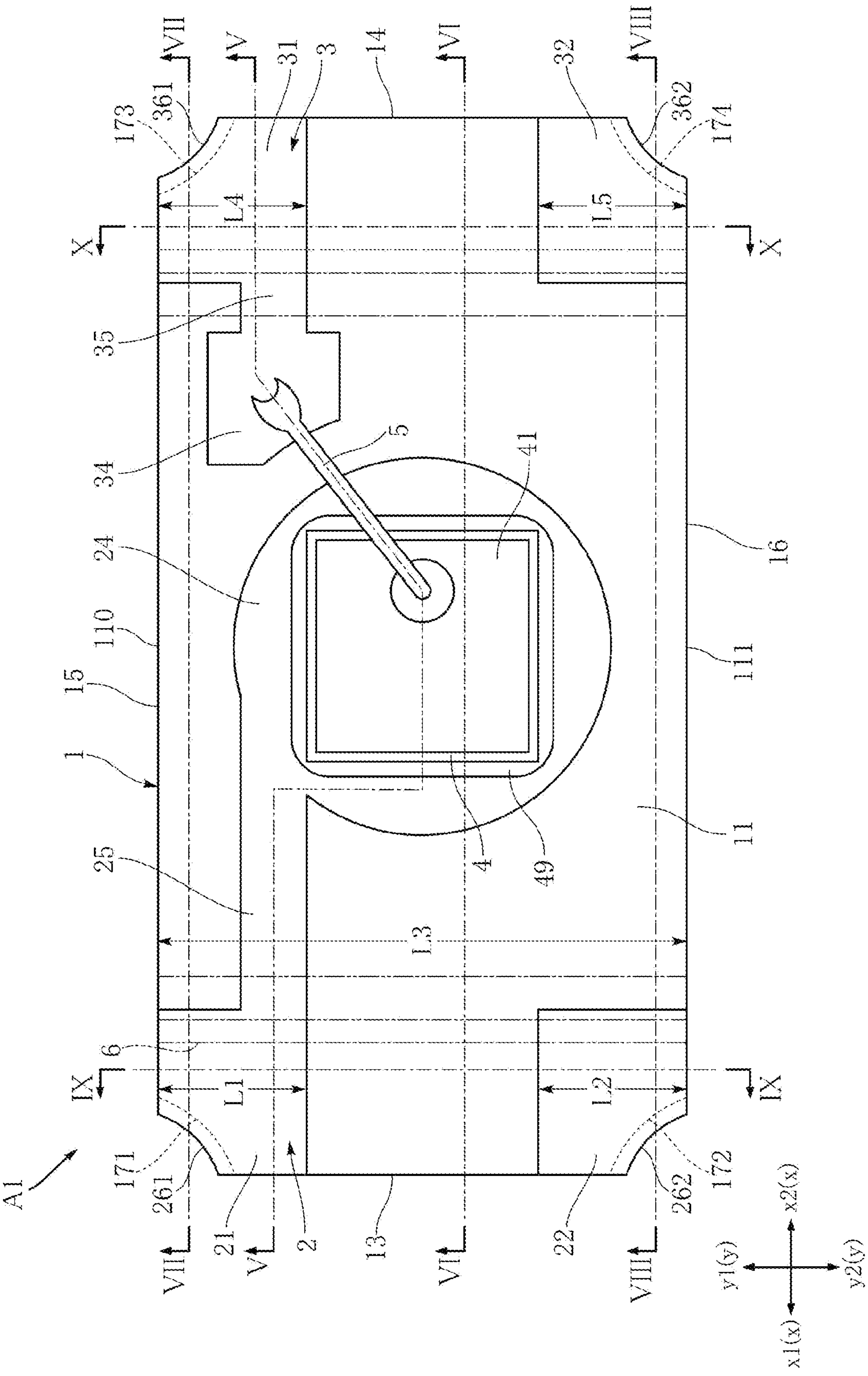
FIG. 1 is a plan view of a semiconductor light emitting device according to a first embodiment of the present disclosure.

Hereinafter, preferred embodiments of the present disclosure will specifically be described with reference to the accompanying drawings.

The terms "first," "second," "third," and so on are used simply as labels in the present disclosure, and are not necessarily meant to give an order to objects to which such labels are attached.

When an object A is described as being formed on an object B in the present disclosure, it may mean either that the object A is formed directly on the object B, or that the object A is formed on the object B with another object intervening between the object A and the object B, unless otherwise specifically stated. Similarly, when an object A is described as being disposed on an object B in the present disclosure, it may mean either that the object A is disposed directly on the object B, or that the object A is disposed on the object B with another object intervening between the object A and the object B, unless otherwise specifically stated. Similarly, when an object A is described as being positioned on an object B in the present disclosure, it may mean either that the object A is positioned on the object B with the object A being in contact with the object B, or that the object A is positioned on the object B with another object intervening between the object A and the object B, unless otherwise specifically stated. In addition, when an object A is described as overlapping an object B when viewed in a given direction in the present disclosure, it may mean either that the object A overlaps the entire object B when viewed in the given direction, or that the object A overlaps a portion of the object B when viewed in the given direction, unless otherwise specifically stated. Moreover, when a surface A is described as facing in a direction B (or a first side or a second side in the direction B) in the present disclosure, it may mean either that the surface A is at an angle of 90° with respect to the direction B, or that the surface A is inclined with respect to the direction B. Furthermore, when an object A is described as being supported by an object B in the present disclosure, it may mean either that the object A is directly supported by the object B, or that the object A is supported by the object B with another object intervening between the object A and the object B, unless otherwise specifically stated.

First Embodiment

FIGS. 1 to 10 illustrate a semiconductor light emitting device according to a first embodiment of the present disclosure. The semiconductor light emitting device, denoted by A1, according to the present embodiment includes a board 1, a first electrode 2, a second electrode 3, a semiconductor light emitting element 4, a wire 5, a light-transmitting resin 6, and an insulating film 7.

Figure 2:
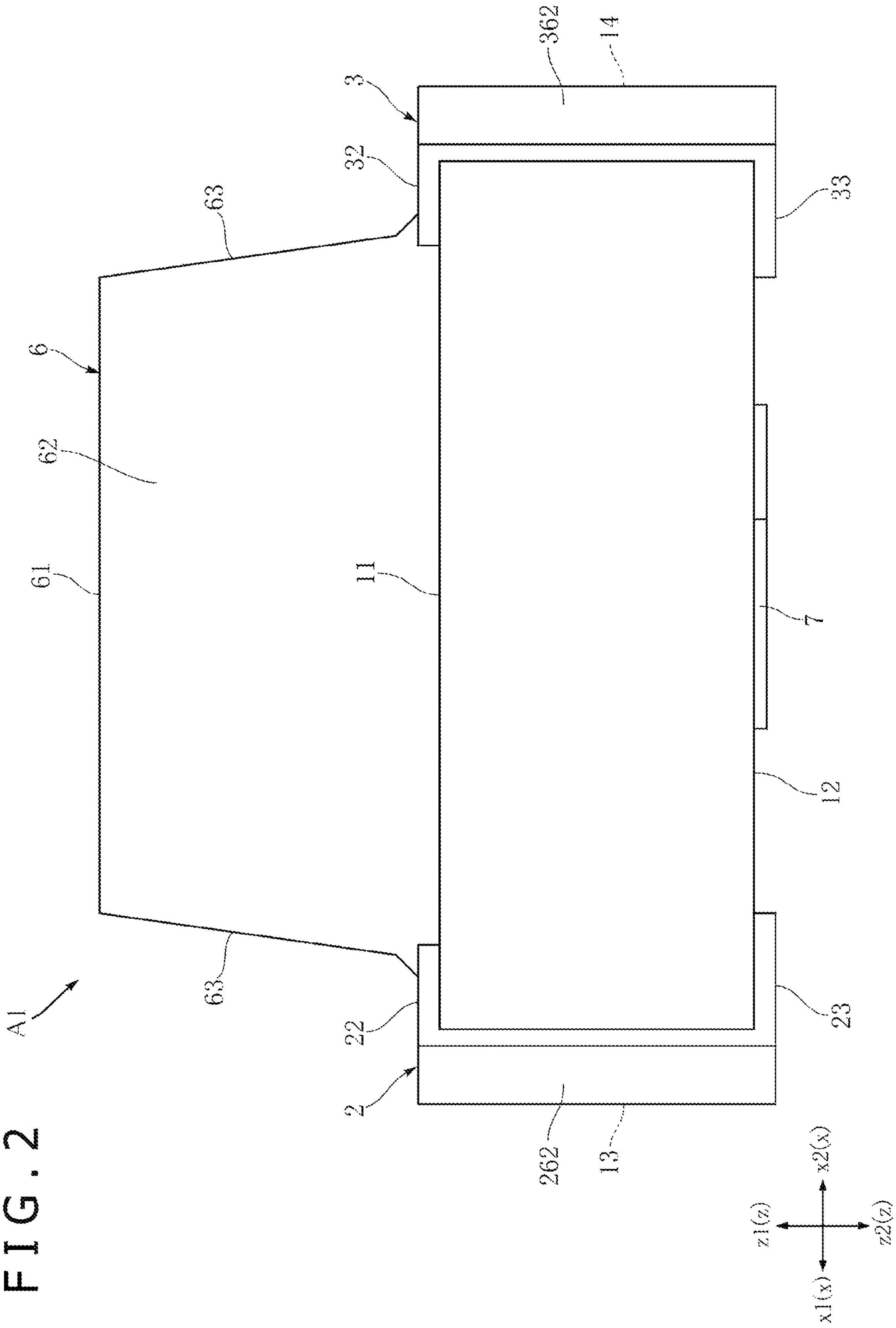
FIG. 2 is a front view of the semiconductor light emitting device according to the first embodiment of the present disclosure.
Figure 3:
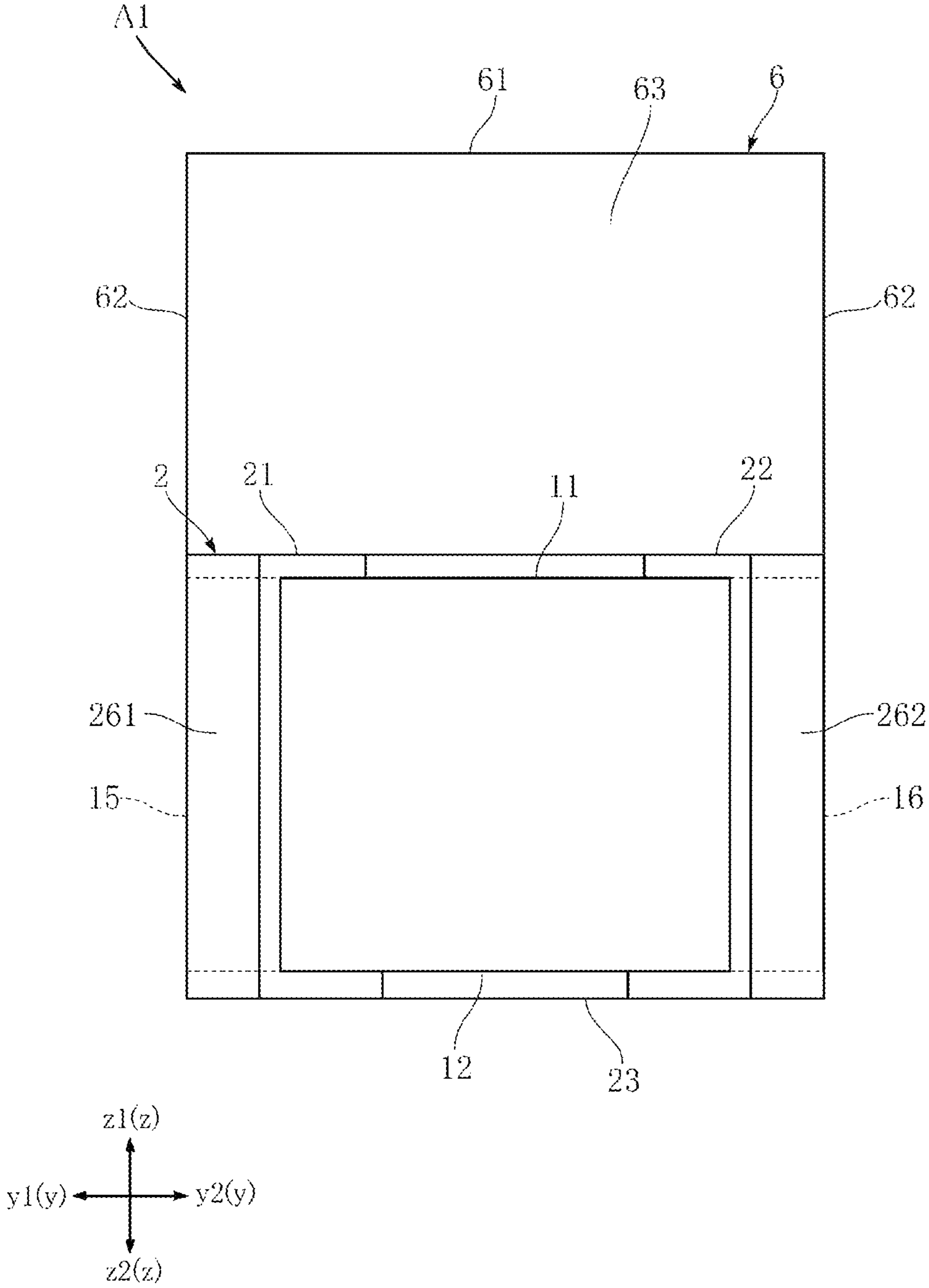
FIG. 3 is a left side view of the semiconductor light emitting device according to the first embodiment of the present disclosure.
Figure 4:
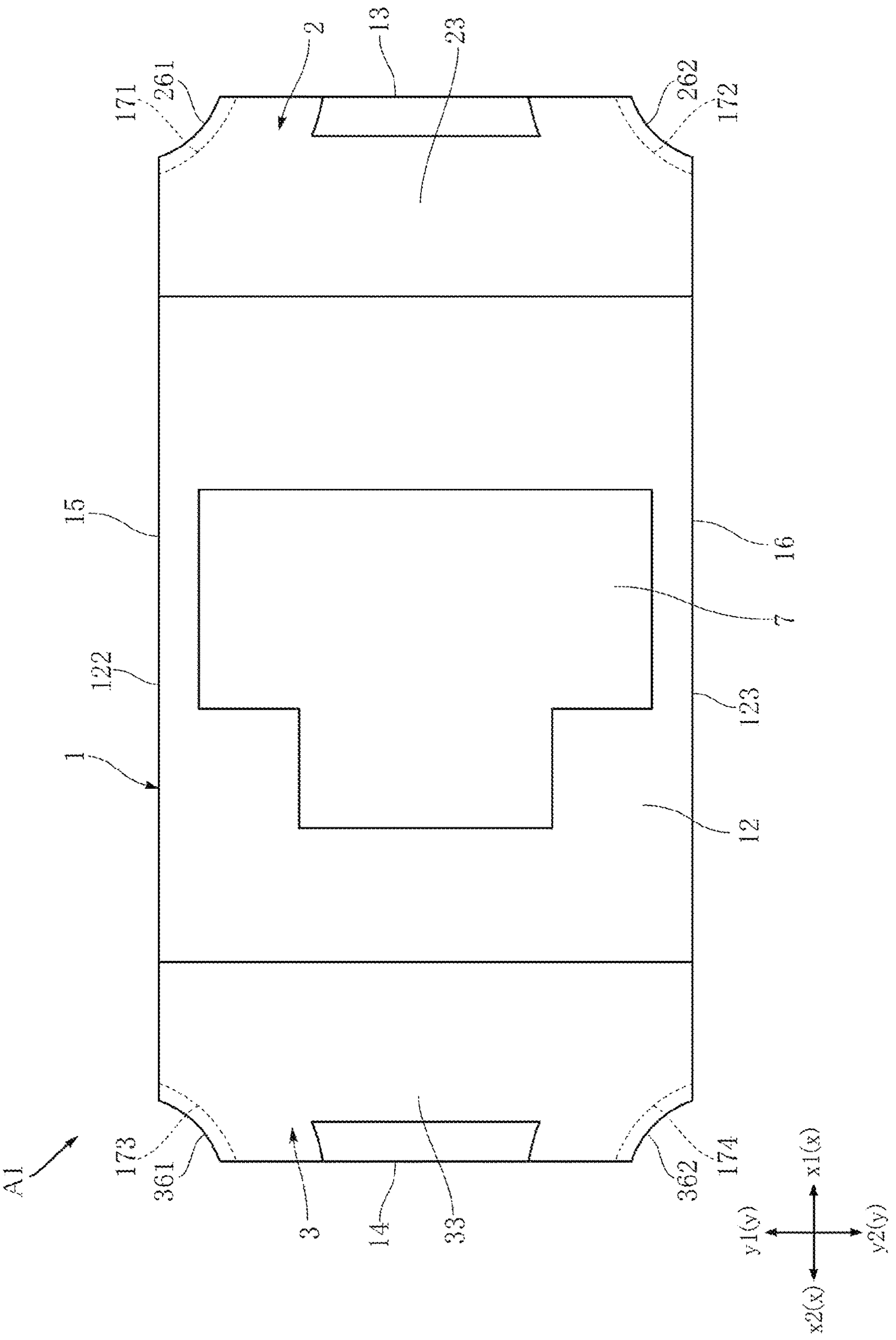
FIG. 4 is a bottom view of the semiconductor light emitting device according to the first embodiment of the present disclosure.
Figure 5:
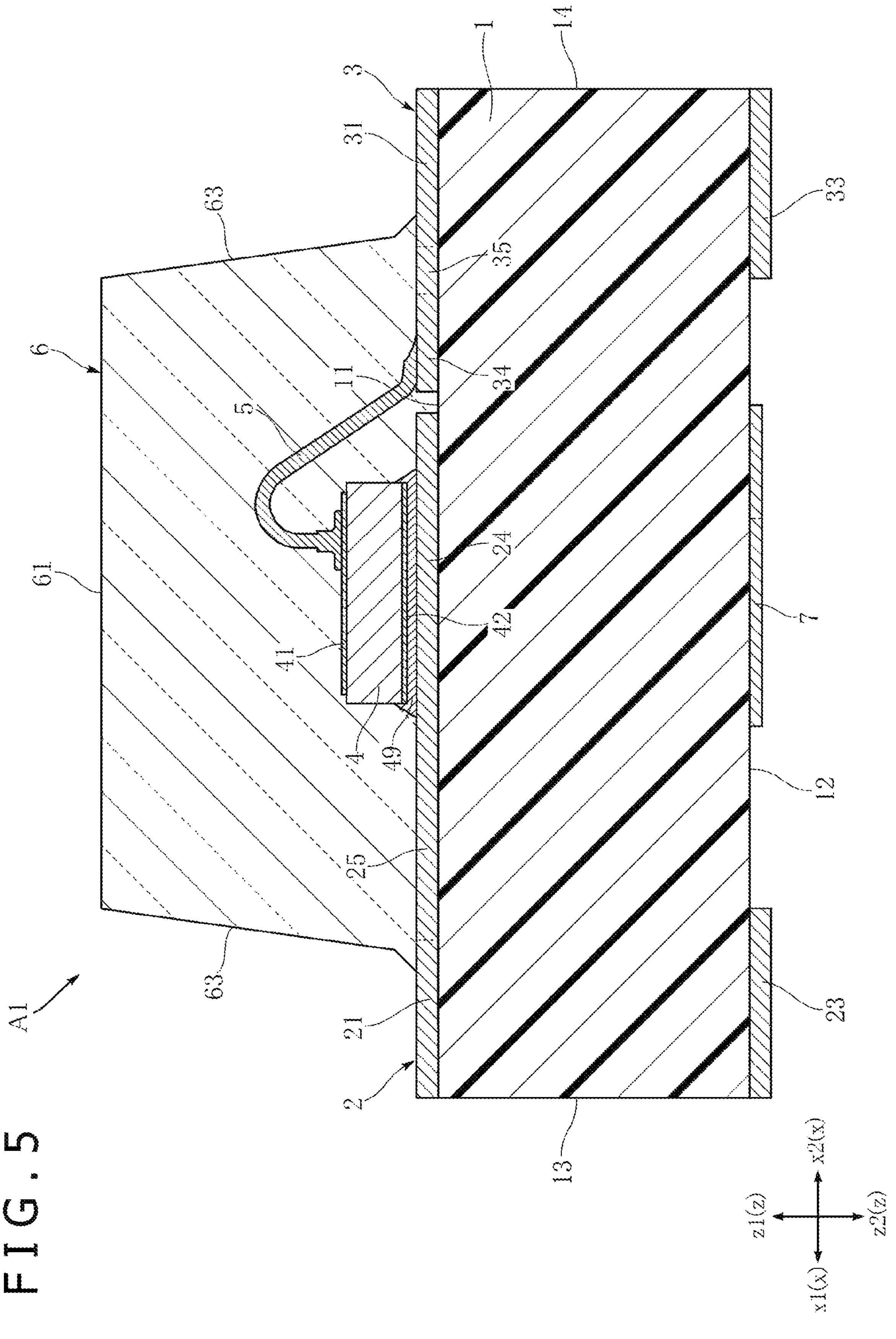
FIG. 5 is a sectional view of the semiconductor light emitting device taken along line V-V in FIG. 1.
Figure 6:
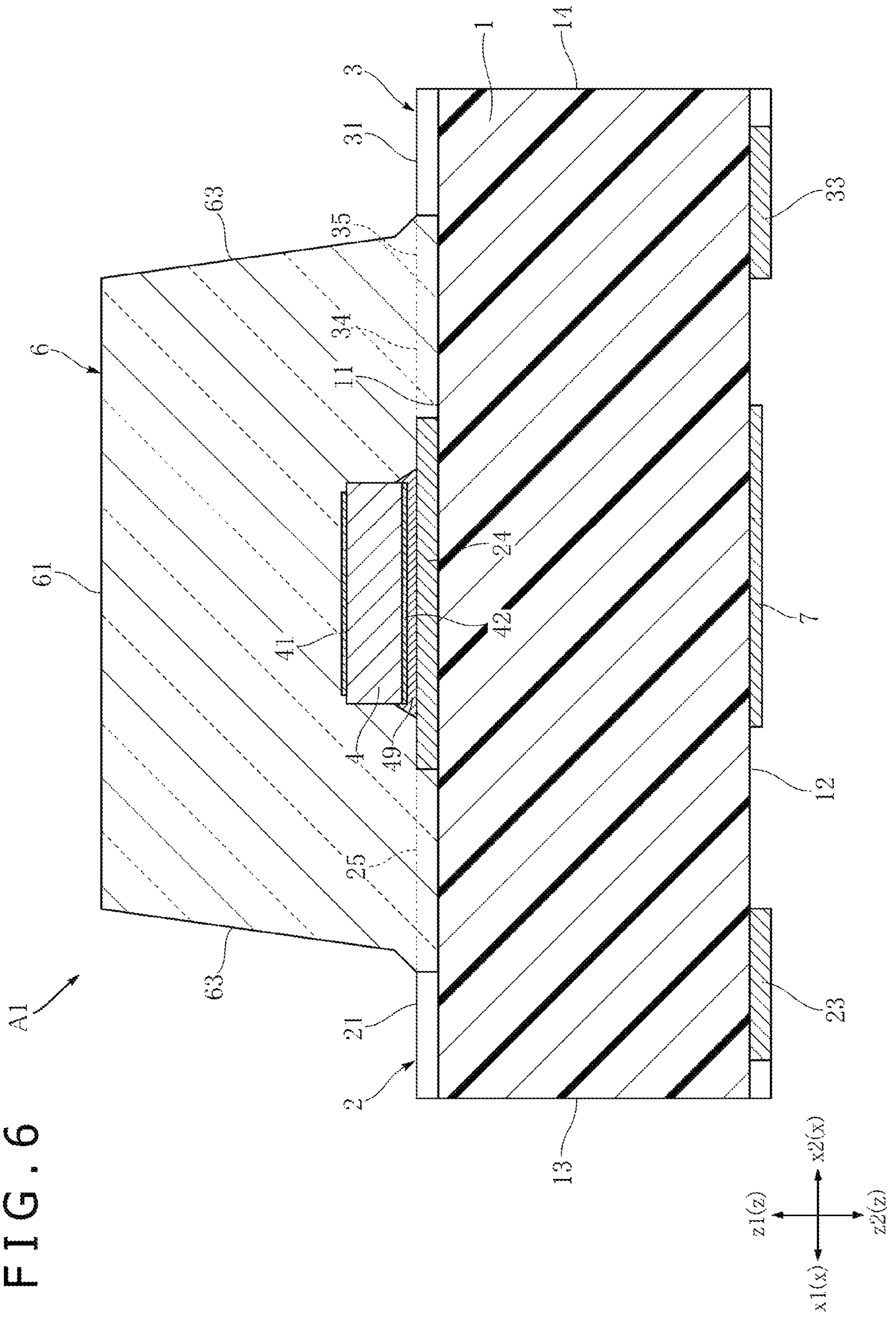
FIG. 6 is a sectional view of the semiconductor light emitting device taken along line VI-VI in FIG. 1.
Figure 7:
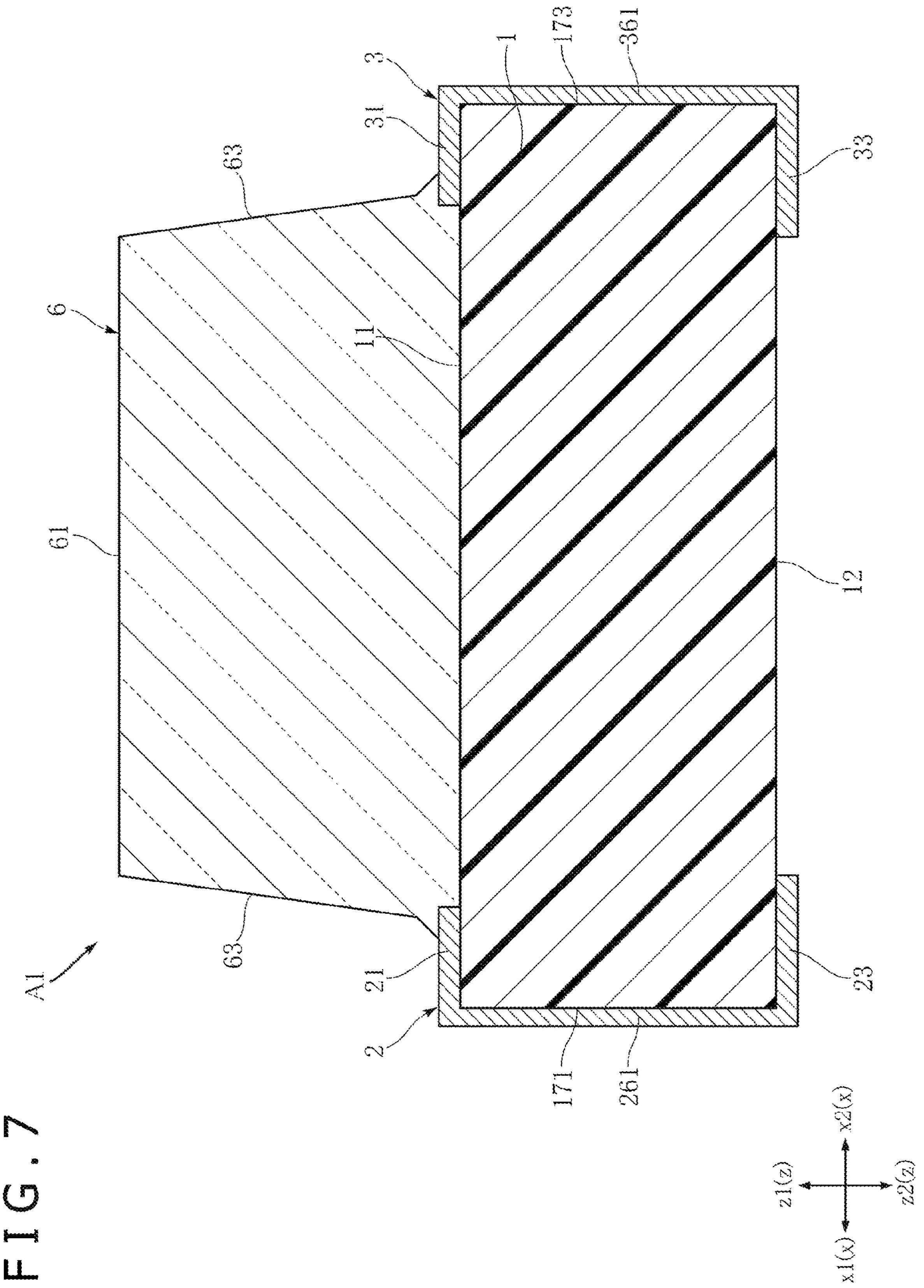
FIG. 7 is a sectional view of the semiconductor light emitting device taken along line VII-VII in FIG. 1.
Figure 8:
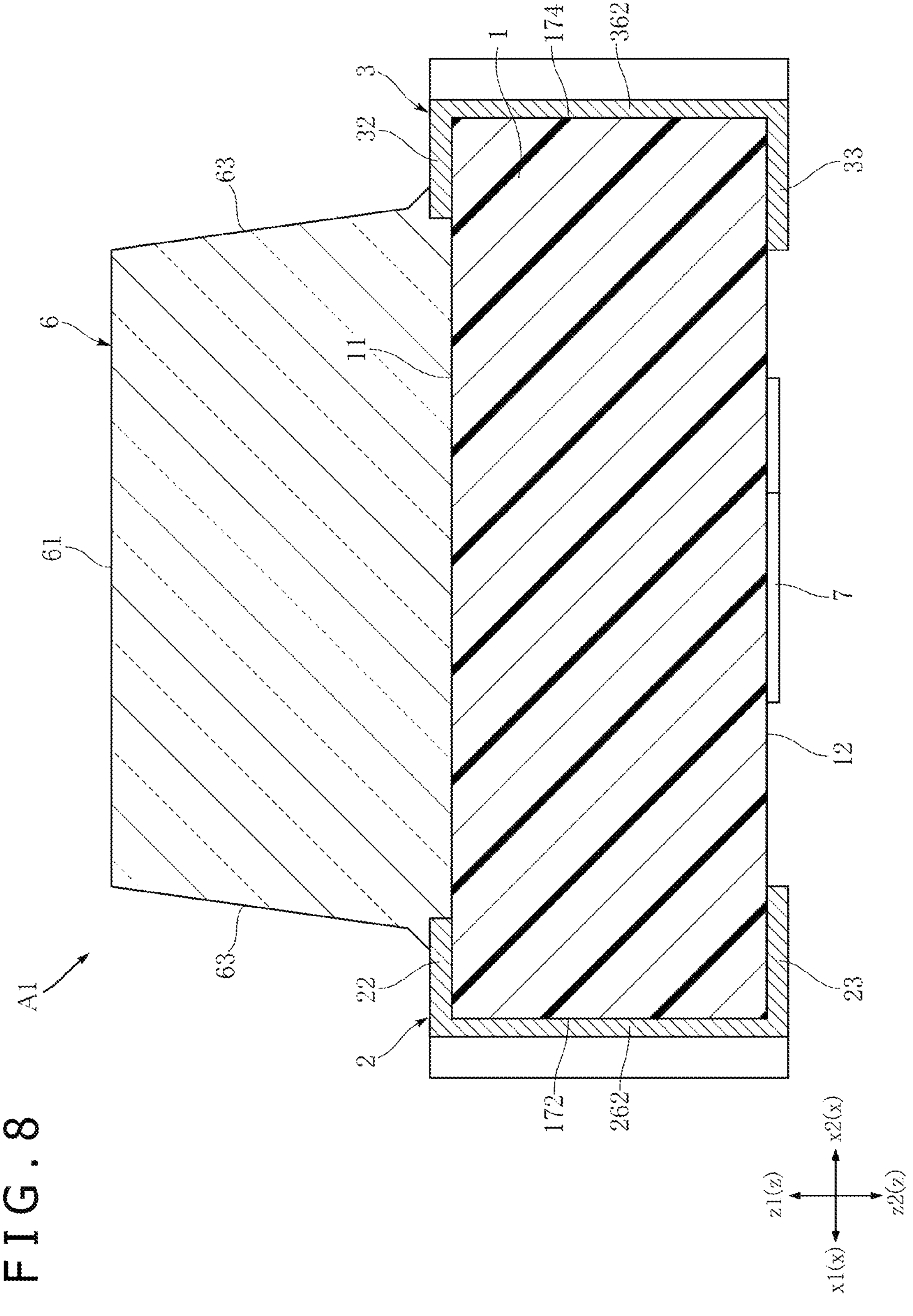
FIG. 8 is a sectional view of the semiconductor light emitting device taken along line VIII-VIII in FIG. 1.
Figure 9:
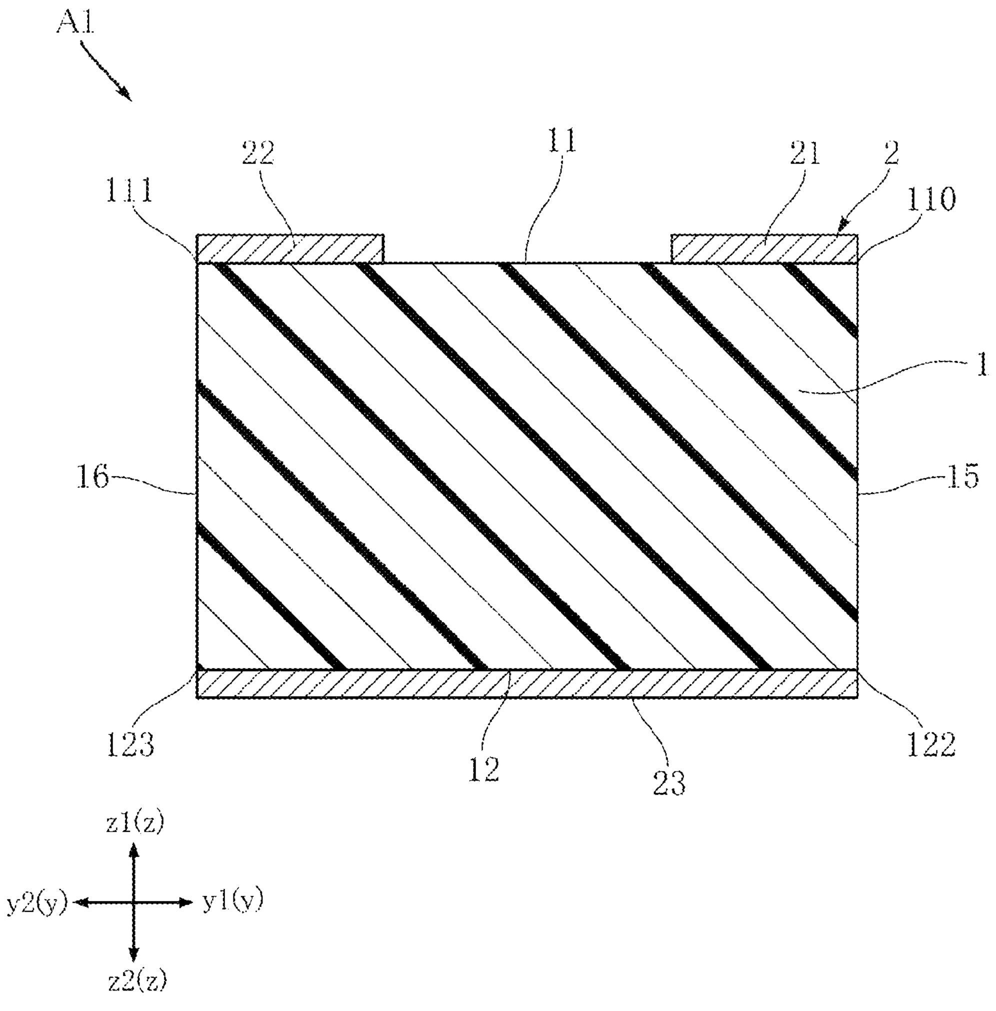
FIG. 9 is a sectional view of the semiconductor light emitting device taken along line IX-IX in FIG. 1.
Figure 10:
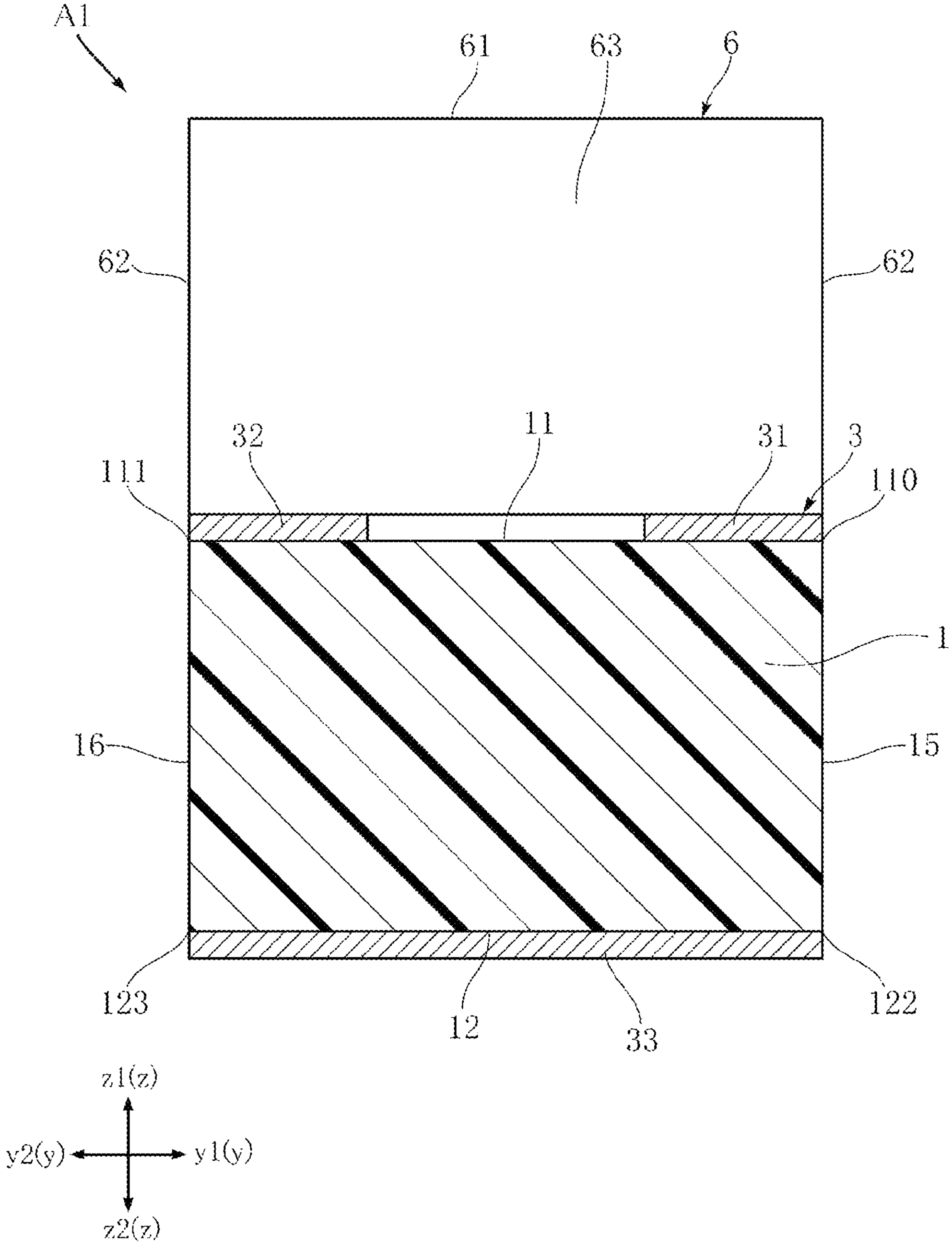
FIG. 10 is a sectional view of the semiconductor light emitting device taken along line X-X in FIG. 1.

FIG. 1 is a plan view of the semiconductor light emitting device A1. FIG. 2 is a front view of the semiconductor light emitting device A1. FIG. 3 is a left side view of the semiconductor light emitting device A1. FIG. 4 is a bottom view of the semiconductor light emitting device A1. FIG. 5 is a sectional view of the semiconductor light emitting device A1 taken along line V-V in FIG. 1. FIG. 6 is a sectional view of the semiconductor light emitting device A1 taken along line VI-VI in FIG. 1. FIG. 7 is a sectional view of the semiconductor light emitting device A1 taken along line VII-VII in FIG. 1. FIG. 8 is a sectional view of the semiconductor light emitting device A1 taken along line VIII-VIII in FIG. 1. FIG. 9 is a sectional view of the semiconductor light emitting device A1 taken along line IX-IX in FIG. 1. FIG. 10 is a sectional view of the semiconductor light emitting device A1 taken along line X-X in FIG. 1. Note that, in FIG. 1, the light-transmitting resin 6 is depicted as being transparent for the sake of easier understanding.

In the following description of the semiconductor light emitting device A1, the thickness direction of the semiconductor light emitting device A1 (i.e., the direction in which the plan view of the semiconductor light emitting device A1 is viewed), which is an example of a "thickness direction" of the present disclosure, is referred to as a "thickness direction z." A direction perpendicular to the thickness direction z, which is an example of a "first direction" of the present disclosure, is referred to as a "first direction x." A direction perpendicular to both the thickness direction z and the first direction x, which is an example of a "second direction" of the present disclosure, is referred to as a "second direction y." In addition, the left side in FIG. 1, which is an example of a "first side in the first direction" of the present disclosure, is referred to as a "first side x1 in the first direction," while the right side in FIG. 1, which is an example of a "second side in the first direction" of the present disclosure, is referred to as a "second side x2 in the first direction." The upper side in FIG. 1, which is an example of a "first side in the second direction" of the present disclosure, is referred to as a "first side y1 in the second direction," while the lower side in FIG. 1, which is an example of a "second side in the second direction" of the present disclosure, is referred to as a "second side y2 in the second direction." The upper side in FIG. 2, which is an example of a "first side in the thickness direction" of the present disclosure, is referred to as a "first side z1 in the thickness direction," while the lower side in FIG. 2, which is an example of a "second side in the thickness direction" of the present disclosure, is referred to as a "second side z2 in the thickness direction." As illustrated in FIG. 1, the semiconductor light emitting device A1 is substantially rectangular when viewed in the thickness direction z. Note that the size of the semiconductor light emitting device A1 is not limited in any manner.

The board 1 is substantially in the shape of a rectangular parallelepiped and includes an insulating material such as a glass epoxy resin. The size of the board 1 is not limited in any manner, and the board 1 may have, for example, a dimension of approximately 1.6 mm in the first direction x, a dimension of approximately 0.8 mm in the second direction y, and a dimension of approximately 0.6 mm in the thickness direction z.

The board 1 includes a first principal surface 11, a second principal surface 12, and side surfaces 13, 14, 15, and 16. The first principal surface 11 is a flat surface facing the first side z1 in the thickness direction. The second principal surface 12 is a flat surface facing the second side z2 in the thickness direction. The side surface 13 lies between the first principal surface 11 and the second principal surface 12 in the thickness direction z and faces the first side x1 in the first direction. The side surface 14 lies between the first principal surface 11 and the second principal surface 12 in the thickness direction z and faces the second side x2 in the first direction. The side surface 15 lies between the first principal surface 11 and the second principal surface 12 in the thickness direction z and faces the first side y1 in the second direction. The side surface 16 lies between the first principal surface 11 and the second principal surface 12 in the thickness direction z and faces the second side y2 in the second direction.

As illustrated in FIG. 1, the first principal surface 11 includes an edge 110 and a first edge 111. The edge 110 is an edge of the first principal surface 11 which lies on the first side y1 in the second direction, and extends along the first direction x. The first edge 111 is an edge of the first principal surface 11 which lies on the second side y2 in the second direction, and extends along the first direction x. In the present embodiment, the edge 110 forms a boundary between the first principal surface 11 and the side surface 15. Meanwhile, the first edge 111 forms a boundary between the first principal surface 11 and the side surface 16.

As illustrated in FIG. 4, the second principal surface 12 includes a second edge 122 and a third edge 123. The second edge 122 is an edge of the second principal surface 12 which lies on the first side y1 in the second direction, and extends along the first direction x. The third edge 123 is an edge of the second principal surface 12 which lies on the second side y2 in the second direction, and extends along the first direction x. In the present embodiment, the second edge 122 forms a boundary between the second principal surface 12 and the side surface 15. Meanwhile, the third edge 123 forms a boundary between the second principal surface 12 and the side surface 16.

In the present embodiment, the board 1 includes recessed grooves 171, 172, 173, and 174. The recessed groove 171 is recessed from each of the side surface 13 and the side surface 15. The recessed groove 172 is recessed from each of the side surface 13 and the side surface 16. The recessed groove 173 is recessed from each of the side surface 14 and the side surface 15. The recessed groove 174 is recessed from each of the side surface 14 and the side surface 16. Each of the recessed grooves 171 to 174 reaches each of the first principal surface 11 and the second principal surface 12 in the thickness direction z. A section of each of the recessed grooves 171 to 174 taken along a plane perpendicular to the thickness direction z is substantially in the shape of a quarter of a circle.

In the present embodiment, each of the first electrode 2 and the second electrode 3 is disposed on the board 1. Each of the first electrode 2 and the second electrode 3 includes an electrically conductive material such as a metal such as copper (Cu), nickel (Ni), iron (Fe), tin (Sn), silver (Ag), or gold (Au) or an alloy of such metals. Each of the first electrode 2 and the second electrode 3 may be formed by any desirable method, and may be formed by, for example, plating.

As illustrated in FIGS. 1 to 5 and 7 to 9, the first electrode 2 according to the present embodiment includes a first portion 21, a second portion 22, a third portion 23, a first bonding portion 24, a first connection portion 25, and groove junction portions 261 and 262.

As illustrated in FIGS. 1, 5, and so on, each of the first portion 21, the second portion 22, the first bonding portion 24, and the first connection portion 25 is formed on the first principal surface 11. In the present embodiment, the first bonding portion 24 is positioned in the middle of the first principal surface 11 in the first direction x and in the middle of the first principal surface 11 in the second direction y. The first bonding portion 24 is circular when viewed in the thickness direction z. The first bonding portion 24 is a portion to which the semiconductor light emitting element 4 is attached through die bonding.

Each of the first portion 21 and the second portion 22 is positioned on the first side x1 in the first direction on the first principal surface 11. The first portion 21 is positioned on the first side y1 in the second direction on the first principal surface 11. As illustrated in FIGS. 1 and 9, the first portion 21 adjoins the edge 110. As illustrated in FIG. 1, the first portion 21 is connected to the first bonding portion 24 on the first principal surface 11. The second portion 22 is positioned on the second side y2 in the second direction on the first principal surface 11. The second portion 22 adjoins the first edge 111. The second portion 22 is apart from the first bonding portion 24 on the first principal surface 11. In addition, the second portion 22 is apart from the first portion 21 in the second direction y.

The first connection portion 25 is positioned close to the first side y1 in the second direction on the first principal surface 11. The first connection portion 25 is connected to both the first bonding portion 24 and the first portion 21 on the first principal surface 11. Thus, the first portion 21 is connected to the first bonding portion 24 through the first connection portion 25 on the first principal surface 11.

As illustrated in FIG. 1, in the present embodiment, the dimension (i.e., a first dimension L1) of the first portion 21 measured in the second direction y and the dimension (i.e., a second dimension L2) of the second portion 22 measured in the second direction y are equal to each other. When the first dimension L1 and the second dimension L2 are described as being equal to each other here, the first dimension L1 and the second dimension L2 may not necessarily be exactly equal to each other, but may slightly be different from each other due to an error in manufacturing or other reasons.

The dimension (i.e., the second dimension L2) of the second portion 22 measured in the second direction y is, for example, in a range of 0.1 to 0.8 times the dimension (i.e., a third dimension L3) of the first principal surface 11 measured in the second direction y. In the example illustrated in FIG. 1, the second dimension L2 is approximately 0.28 times the third dimension L3.

The third portion 23 is formed on a place different from the first principal surface 11. As illustrated in FIGS. 3 to 5 and 9, in the present embodiment, the third portion 23 is formed on the second principal surface 12. The third portion 23 is positioned on the first side x1 in the first direction on the second principal surface 12. The third portion 23 extends along the second direction y and adjoins both the second edge 122 and the third edge 123.

As illustrated in FIGS. 1, 4, 7, and 8, the groove junction portion 261 is formed in the recessed groove 171, and the groove junction portion 262 is formed in the recessed groove 172. The groove junction portion 261 covers the entire recessed groove 171. The groove junction portion 261 is connected to both the first portion 21 and the third portion 23. The groove junction portion 262 covers the entire recessed groove 172. The groove junction portion 262 is connected to both the second portion 22 and the third portion 23. The above configuration causes the first portion 21 and the second portion 22 to be electrically continuous with each other through the third portion 23 and the groove junction portions 261 and 262. Each of the groove junction portions 261 and 262 is an example of a portion of a third portion of the present disclosure.

As illustrated in FIGS. 1, 2, 5, 7, 8, and 10, the second electrode 3 according to the present embodiment includes a fourth portion 31, a fifth portion 32, a sixth portion 33, a second bonding portion 34, a second connection portion 35, and groove junction portions 361 and 362.

As illustrated in FIGS. 1, 5, and so on, each of the fourth portion 31, the fifth portion 32, the second bonding portion 34, and the second connection portion 35 is formed on the first principal surface 11. In the present embodiment, the second bonding portion 34 is positioned close to the second side x2 in the first direction and close to the first side y1 in the second direction on the first principal surface 11. The second bonding portion 34 is apart from the first bonding portion 24 on the second side x2 thereof in the first direction and on the first side y1 thereof in the second direction. The second bonding portion 34 is a portion to which the wire 5 is bonded.

Each of the fourth portion 31 and the fifth portion 32 is positioned on the second side x2 in the first direction on the first principal surface 11. The fourth portion 31 is positioned on the first side y1 in the second direction on the first principal surface 11. As illustrated in FIGS. 1 and 10, the fourth portion 31 adjoins the edge 110. As illustrated in FIG. 1, the fourth portion 31 is connected to the second bonding portion 34 on the first principal surface 11. The fifth portion 32 is positioned on the second side y2 in the second direction on the first principal surface 11. The fifth portion 32 adjoins the first edge 111. The fifth portion 32 is apart from the second bonding portion 34 on the first principal surface 11. In addition, the fifth portion 32 is apart from the fourth portion 31 in the second direction y.

The second connection portion 35 is positioned close to the first side y1 in the second direction on the first principal surface 11. The second connection portion 35 is connected to both the second bonding portion 34 and the fourth portion 31 on the first principal surface 11. Thus, the fourth portion 31 is connected to the second bonding portion 34 through the second connection portion 35 on the first principal surface 11.

As illustrated in FIG. 1, in the present embodiment, the dimension (i.e., a fourth dimension L4) of the fourth portion 31 measured in the second direction y and the dimension (i.e., a fifth dimension L5) of the fifth portion 32 measured in the second direction y are equal to each other. When the fourth dimension L4 and the fifth dimension L5 are described as being equal to each other here, the fourth dimension L4 and the fifth dimension L5 may not necessarily be exactly equal to each other, but may slightly be different from each other due to an error in manufacturing or other reasons.

The dimension (i.e., the fifth dimension L5) of the fifth portion 32 measured in the second direction y is, for example, in a range of 0.1 to 0.8 times the dimension (i.e., the third dimension L3) of the first principal surface 11 measured in the second direction y. In the example illustrated in FIG. 1, the fifth dimension L5 is approximately 0.28 times the third dimension L3.

The sixth portion 33 is formed on a place different from the first principal surface 11. As illustrated in FIGS. 3 to 5 and 10, in the present embodiment, the sixth portion 33 is formed on the second principal surface 12. The sixth portion 33 is positioned on the second side x2 in the first direction on the second principal surface 12. The sixth portion 33 extends along the second direction y and adjoins both the second edge 122 and the third edge 123.

As illustrated in FIGS. 1, 4, 7, and 8, the groove junction portion 361 is formed in the recessed groove 173, and the groove junction portion 362 is formed in the recessed groove 174. The groove junction portion 361 covers the entire recessed groove 173. The groove junction portion 361 is connected to both the fourth portion 31 and the sixth portion 33. The groove junction portion 362 covers the entire recessed groove 174. The groove junction portion 362 is connected to both the fifth portion 32 and the sixth portion 33. The above configuration causes the fourth portion 31 and the fifth portion 32 to be electrically continuous with each other through the sixth portion 33 and the groove junction portions 361 and 362. Each of the groove junction portions 361 and 362 is an example of a portion of a sixth portion of the present disclosure.

The semiconductor light emitting element 4 is a light emitting source of the semiconductor light emitting device A1. The specific structure of the semiconductor light emitting element 4 is not limited in any manner, and the semiconductor light emitting element 4 is, for example, a light-emitting diode (LED) or a laser diode (LD). In the present embodiment, the semiconductor light emitting element 4 is, for example, an LED. Note that the number of semiconductor light emitting elements included in semiconductor light emitting devices according to embodiments of the present disclosure is not limited to any particular values, and may be two or more.

As illustrated in FIGS. 1, 5, and 6, the semiconductor light emitting element 4 includes an electrode 41 and an electrode 42. The electrode 41 is disposed on the first side z1 in the thickness direction. The electrode 42 is disposed on the second side z2 in the thickness direction. The electrode 42 is joined and electrically connected to the first bonding portion 24 through a joining material 49. The joining material 49 is, for example, an electrically conductive joining material such as a solder or an Ag paste. The semiconductor light emitting element 4 thus mounted on the first bonding portion 24 is disposed in a center of the board 1 (i.e., in the middle of the board 1 in each of the first direction x and the second direction y) when viewed in the thickness direction z.

The wire 5 is connected to the second bonding portion 34 and the electrode 41 of the semiconductor light emitting element 4. The wire 5 is made of a metal such as Au. The electrode 41 of the semiconductor light emitting element 4 is joined and electrically connected to the second bonding portion 34 through the wire 5.

The light-transmitting resin 6 covers the semiconductor light emitting element 4, the wire 5, and portions of the first principal surface 11, the first electrode 2, and the second electrode 3. More specifically, the light-transmitting resin 6 covers the first bonding portion 24, the first connection portion 25, a portion of the first portion 21, and a portion of the second portion 22 of the first electrode 2. In addition, the light-transmitting resin 6 covers the second bonding portion 34, the second connection portion 35, a portion of the fourth portion 31, and a portion of the fifth portion 32 of the second electrode 3. The light-transmitting resin 6 is made of a material that allows light coming from the semiconductor light emitting element 4 to pass therethrough, and is formed by, for example, a transparent or semitransparent epoxy resin. The specific structure of the light-transmitting resin 6 is not limited in any manner, and as illustrated in FIGS. 2, 3, 5 to 8, and 10, in the present embodiment, the light-transmitting resin 6 includes a top surface 61, two side surfaces 62, and two slanting surfaces 63.

The top surface 61 is a flat surface that lies on the first side z1 in the thickness direction and extends along each of the first direction x and the second direction y. The two side surfaces 62 are flat surfaces that lie on each of the first side y1 in the second direction and the second side y2 in the second direction and extend along each of the thickness direction z and the first direction x. The side surface 62 that lies on the first side y1 in the second direction is flush (or substantially flush) with the side surface 15 of the board 1. The side surface 62 that lies on the second side y2 in the second direction is flush (or substantially flush) with the side surface 16 of the board 1. The two slanting surfaces 63 lie on each of the first side x1 in the first direction and the second side x2 in the first direction. Each of the slanting surfaces 63 is inclined with respect to the thickness direction z.

As mentioned above, the light-transmitting resin 6 covers a portion of each of the first portion 21 and the second portion 22, and a portion of each of the fourth portion 31 and the fifth portion 32. The portion of each of the first portion 21, the second portion 22, the fourth portion 31, and the fifth portion 32 which is covered by the light-transmitting resin 6 intervenes between the light-transmitting resin 6 and the first principal surface 11. Each of the first portion 21 and the second portion 22 includes a portion that protrudes from the light-transmitting resin 6 to the first side x1 in the first direction. A region of the first principal surface 11 which lies between the portions of the first portion 21 and the second portion 22 which protrude from the light-transmitting resin 6 to the first side x1 in the first direction when viewed in the thickness direction z may be covered by a thin film of the light-transmitting resin 6. In addition, a region of the first principal surface 11 which lies between portions of the fourth portion 31 and the fifth portion 32 which protrude from the light-transmitting resin 6 to the second side x2 in the first direction when viewed in the thickness direction z may be covered by a thin film of the light-transmitting resin 6. This will happen if, when the light-transmitting resin 6 is formed in a process of manufacturing the semiconductor light emitting device A1, a flat portion of a mold that is used to form the light-transmitting resin 6 is pressed against a portion of each of the first portion 21, the second portion 22, the fourth portion 31, and the fifth portion 32, and a resin material flows into a gap surrounded by the mold, the first portion 21, the second portion 22, and the first principal surface 11 and a gap surrounded by the mold, the fourth portion 31, the fifth portion 32, and the first principal surface 11.

As illustrated in FIGS. 2 and 4 to 6, the insulating film 7 is disposed on the second principal surface 12 of the board 1. The specific structure of the insulating film 7 is not limited in any manner, and the insulating film 7 is formed by, for example, a resist layer. The insulating film 7 serves as a mark for deciding a direction in which the semiconductor light emitting device A1 is connected. The insulating film 7 is disposed substantially in the middle in the second direction y and between the third portion 23 and the sixth portion 33 in the first direction x on the second principal surface 12. The insulating film 7 includes a projecting portion that projects in the first direction x toward the sixth portion 33 when viewed in the thickness direction z. The insulating film 7 having such a shape serves as a mark for deciding the direction in which the semiconductor light emitting device A1 is connected.

Figure 11:
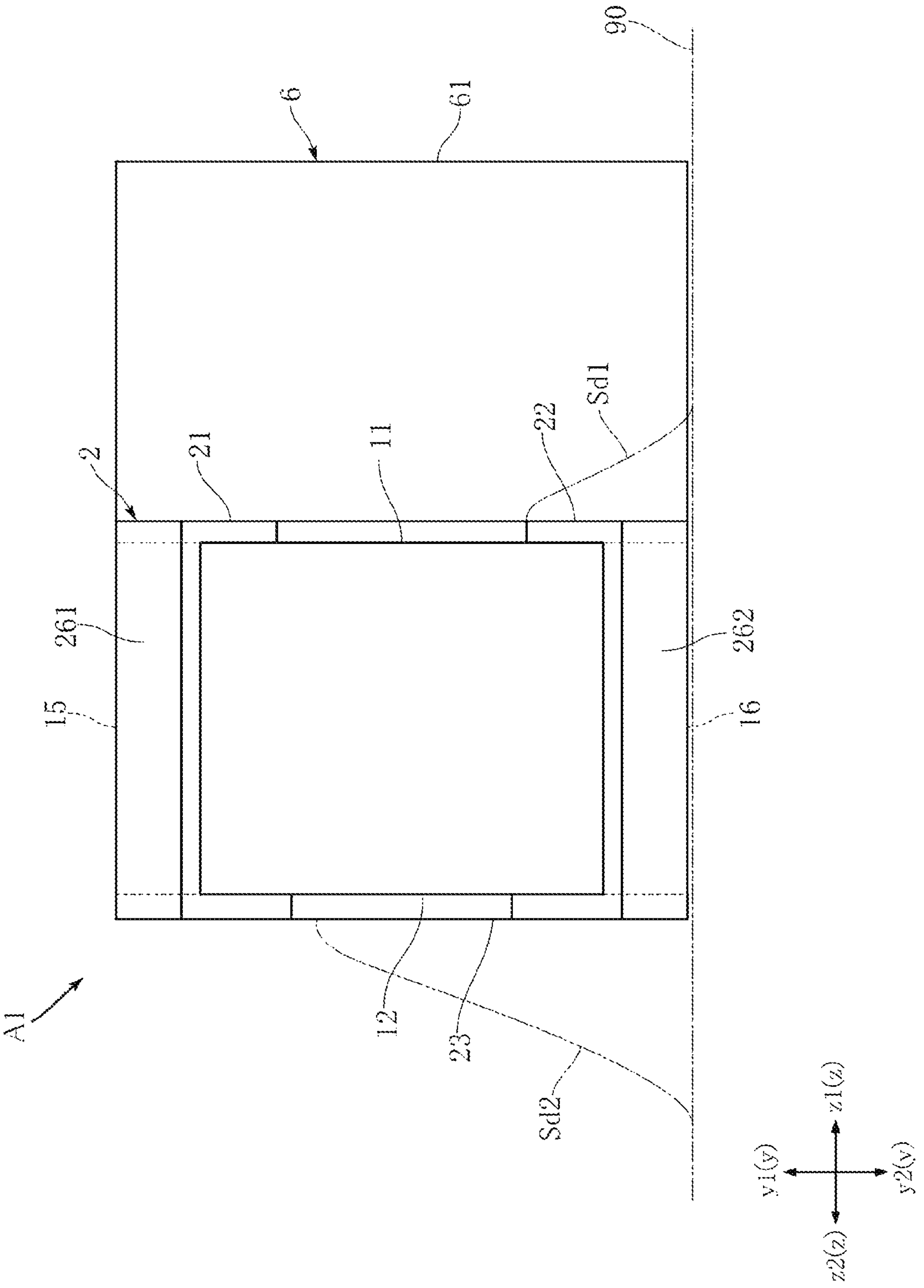
FIG. 11 is a left side view illustrating an example situation of mounting of the semiconductor light emitting device according to the first embodiment of the present disclosure.

FIG. 11 is a left side view illustrating an example situation in which the semiconductor light emitting device A1 is mounted on a mount board. The semiconductor light emitting device A1 is mounted on a mount board 90 (represented by a phantom line) with the side surface 16 (i.e., the surface that faces the second side y2 in the second direction) of the board 1 facing the mount board 90. The semiconductor light emitting device A1 is used as a side-view light source that emits light in a direction parallel to a principal surface of the mount board 90 (toward the right side in FIG. 11). A wiring pattern (not illustrated), for example, is formed on the principal surface of the mount board 90. The semiconductor light emitting device A1 is mounted on the mount board 90 through a joining portion such as a solder. Each of the groove junction portion 262, the second portion 22, the third portion 23, the groove junction portion 362 (not illustrated), the fifth portion 32 (not illustrated), and the sixth portion 33 (not illustrated) is joined to the mount board 90 through the joining portion. In FIG. 11, a joining portion Sd1 and a joining portion Sd2 are represented by phantom lines. The joining portion Sd1 joins the second portion 22 to the mount board 90. The joining portion Sd2 joins the third portion 23 to the mount board 90.

Next, beneficial effects of the semiconductor light emitting device A1 according to the present embodiment will now be described below.

The semiconductor light emitting device A1 includes the first electrode 2 provided on the board 1, and the semiconductor light emitting element 4 mounted on the first principal surface 11 of the board 1. The first electrode 2 includes the first bonding portion 24, the first portion 21, the second portion 22, and the third portion 23. The first bonding portion 24 is formed on the first principal surface 11, and is joined and electrically connected to the semiconductor light emitting element 4 (more specifically, the electrode 42) through the joining material 49. The first portion 21 and the second portion 22 are formed on the first principal surface 11 and are disposed on the first side x1 in the first direction on the board 1. The first portion 21 is connected to the first bonding portion 24 on the first principal surface 11. Meanwhile, the second portion 22 is apart from the first bonding portion 24 on the first principal surface 11 and is also apart from the first portion 21 in the second direction y. The third portion 23 is formed on a place (in the present embodiment, the second principal surface 12) different from the first principal surface 11, and the first portion 21 and the second portion 22 are electrically continuous with each other through the third portion 23 and the groove junction portions 261 and 262.

When the semiconductor light emitting device A1 is mounted on the mount board 90, a solder for the mounting may intrude through a gap between the second portion 22 and the light-transmitting resin 6. When the semiconductor light emitting device A1 has the above-described structure, the second portion 22 is apart from the first bonding portion 24 and the first portion 21 connected thereto, and this prevents the solder from reaching the first portion 21 or the first bonding portion 24 even if the solder intrudes into the semiconductor light emitting device A1 and travels along the second portion 22. Therefore, the configuration in which the first electrode 2 includes the first portion 21, the second portion 22, the third portion 23, and the first bonding portion 24 as described above can prevent a trouble such as an unwanted electrical connection due to intrusion of the solder. In addition, the semiconductor light emitting device A1 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A1.

The semiconductor light emitting device A1 further includes the second electrode 3 provided on the board 1. The second electrode 3 includes the second bonding portion 34, the fourth portion 31, the fifth portion 32, and the sixth portion 33. The second bonding portion 34 is formed on the first principal surface 11, and is joined and electrically connected to the semiconductor light emitting element 4 (more specifically, the electrode 41) through the wire 5. The fourth portion 31 and the fifth portion 32 are formed on the first principal surface 11 and are disposed on the second side x2 in the first direction on the board 1. The fourth portion 31 is connected to the second bonding portion 34 on the first principal surface 11. Meanwhile, the fifth portion 32 is apart from the second bonding portion 34 on the first principal surface 11 and is also apart from the fourth portion 31 in the second direction y. The sixth portion 33 is formed on a place (in the present embodiment, the second principal surface 12) different from the first principal surface 11, and the fourth portion 31 and the fifth portion 32 are electrically continuous with each other through the sixth portion 33 and the groove junction portions 361 and 362.

When the semiconductor light emitting device A1 is mounted on the mount board 90, a solder for the mounting may intrude through a gap between the fifth portion 32 and the light-transmitting resin 6. When the semiconductor light emitting device A1 having the above-described structure has been mounted on the mount board 90, the fifth portion 32 is apart from the second bonding portion 34 and the fourth portion 31 connected thereto, and this prevents the solder from reaching the fourth portion 31 or the second bonding portion 34 even if the solder intrudes into the semiconductor light emitting device A1 and travels along the fifth portion 32. Therefore, the configuration in which the second electrode 3 includes the fourth portion 31, the fifth portion 32, the sixth portion 33, and the second bonding portion 34 as described above can prevent a trouble such as an unwanted electrical connection due to intrusion of the solder. In addition, the semiconductor light emitting device A1 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A1.

The first portion 21 of the first electrode 2 is positioned on the first side y1 in the second direction on the first principal surface 11, and the second portion 22 of the first electrode 2 is positioned on the second side y2 in the second direction on the first principal surface 11. The fourth portion 31 of the second electrode 3 is positioned on the first side y1 in the second direction on the first principal surface 11, and the fifth portion 32 of the second electrode 3 is positioned on the second side y2 in the second direction on the first principal surface 11. The above configuration contributes to properly preventing unwanted intrusion of the solder into the semiconductor light emitting device A1.

The second portion 22 of the first electrode 2 adjoins the first edge 111, which lies on the second side y2 in the second direction, of the first principal surface 11. The third portion 23 is formed on the second principal surface 12 and adjoins both the second edge 122 of the second principal surface 12 on the first side y1 in the second direction and the third edge 123 of the second principal surface 12 on the second side y2 in the second direction. The second dimension L2, which is the dimension of the second portion 22 measured in the second direction y, is equal to the first dimension L1, which is the dimension of the first portion 21 measured in the second direction y. The dimension (i.e., the second dimension L2) of the second portion 22 measured in the second direction y is in the range of 0.1 to 0.8 times the dimension (i.e., the third dimension L3) of the first principal surface 11 measured in the second direction y. Each of the second portion 22 and the third portion 23 is joined to the mount board 90 through the solder. The solder joined to the second portion 22 is formed in a range corresponding to the second dimension L2 of the second portion 22 measured in the second direction y. The solder joined to the third portion 23 is formed in a sufficiently wide range in the second direction y on the third portion 23 (see FIG. 11). The above configuration contributes to increasing strength of the mounting of the semiconductor light emitting device A1.

The fifth portion 32 of the second electrode 3 adjoins the first edge 111, which lies on the second side y2 in the second direction, of the first principal surface 11. The sixth portion 33 is formed on the second principal surface 12 and adjoins both the second edge 122 of the second principal surface 12 on the first side y1 in the second direction and the third edge 123 of the second principal surface 12 on the second side y2 in the second direction. The fifth dimension L5, which is the dimension of the fifth portion 32 measured in the second direction y, is equal to the fourth dimension L4, which is the dimension of the fourth portion 31 measured in the second direction y. The dimension (i.e., the fifth dimension L5) of the fifth portion 32 measured in the second direction y is in the range of 0.1 to 0.8 times the dimension (i.e., the third dimension L3) of the first principal surface 11 measured in the second direction y. Each of the fifth portion 32 and the sixth portion 33 is joined to the mount board 90 through the solder. The solder joined to the fifth portion 32 is formed in a range corresponding to the fifth dimension L5 of the fifth portion 32 measured in the second direction y. The solder joined to the sixth portion 33 is formed in a sufficiently wide range in the second direction y on the sixth portion 33. The above configuration contributes to increasing the strength of the mounting of the semiconductor light emitting device A1.

Second Embodiment

Figure 12:
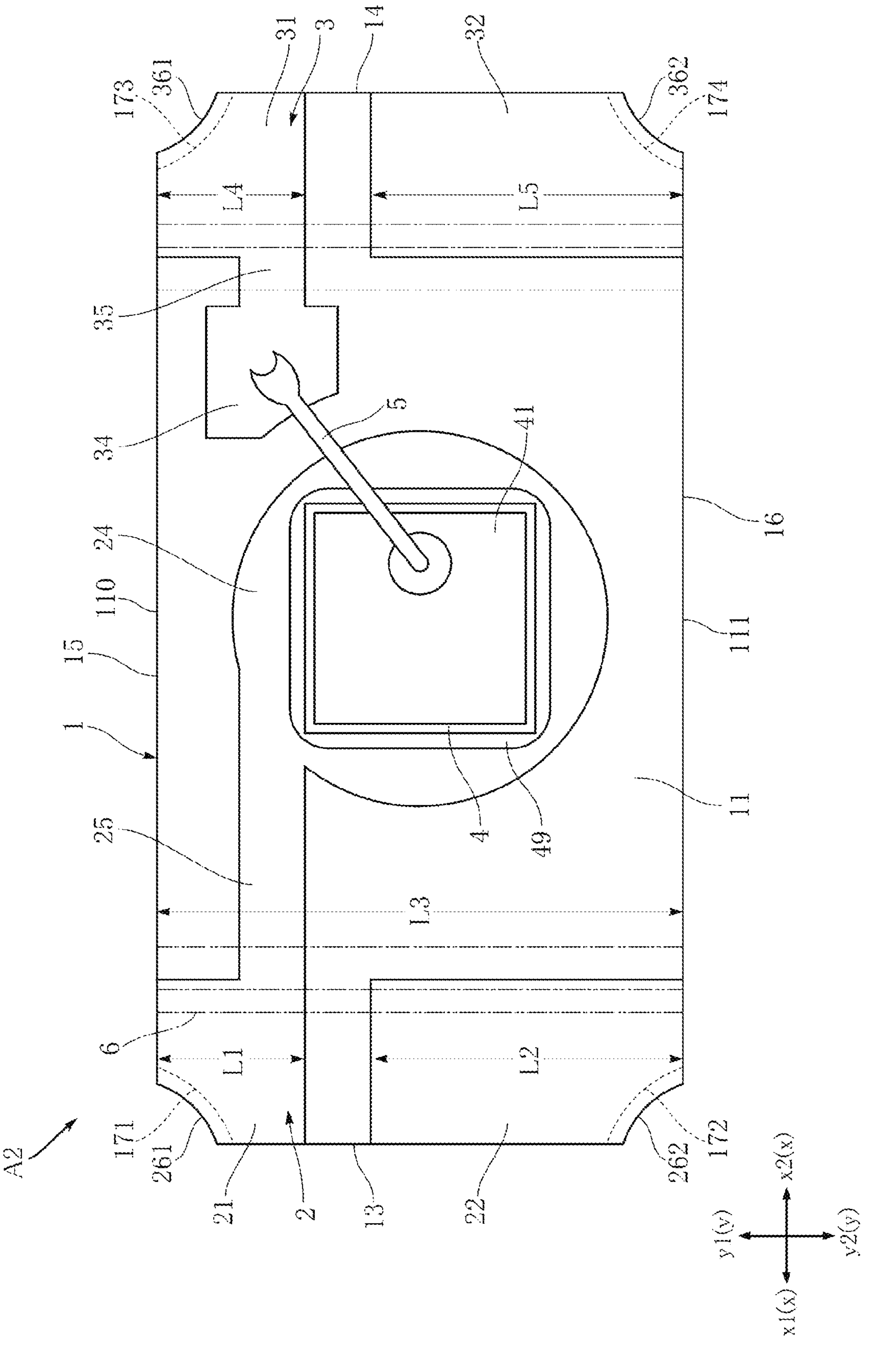
FIG. 12 is a plan view of a semiconductor light emitting device according to a second embodiment of the present disclosure.
Figure 13:
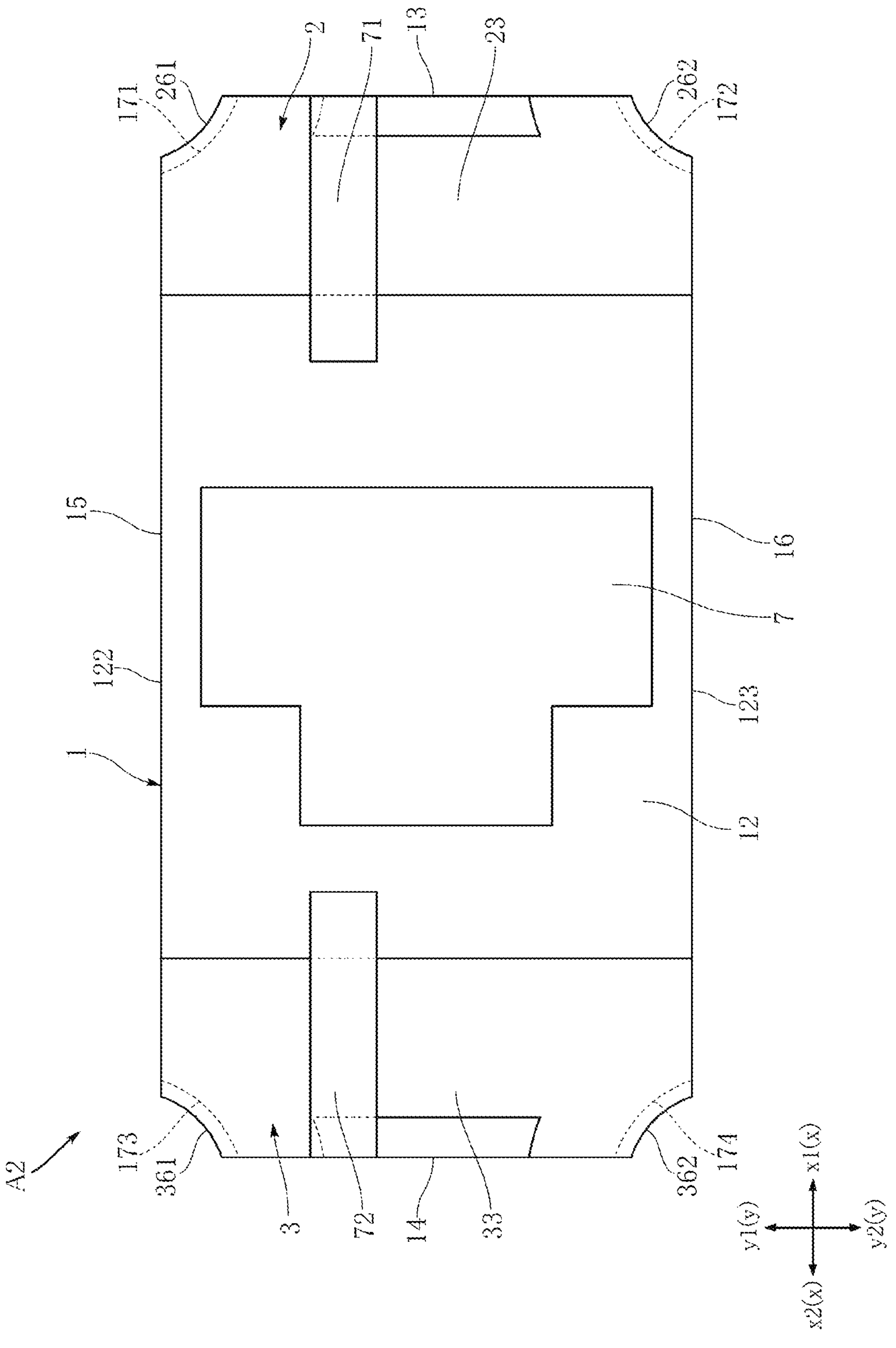
FIG. 13 is a bottom view of the semiconductor light emitting device according to the second embodiment of the present disclosure.
Figure 14:
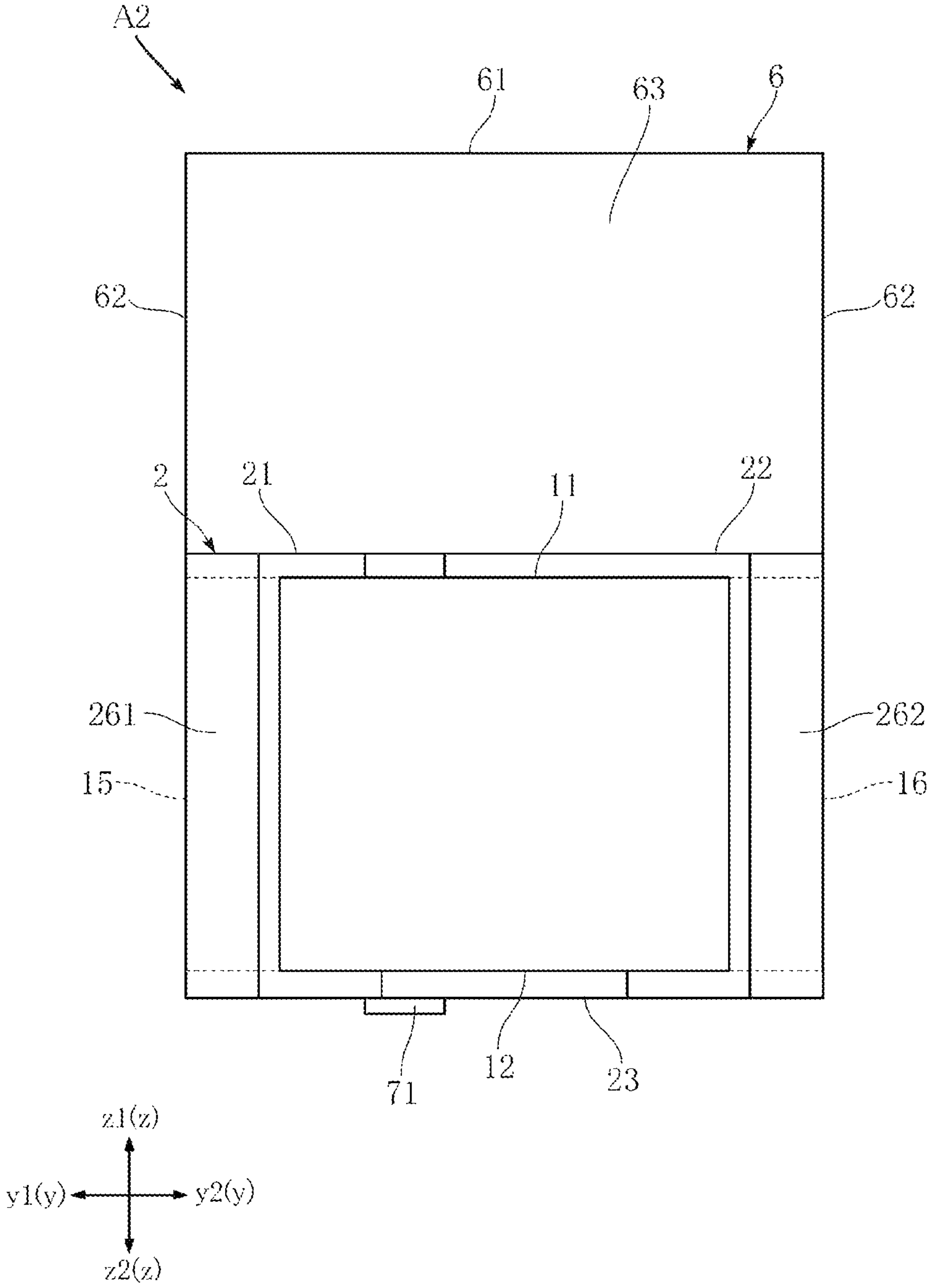
FIG. 14 is a left side view of the semiconductor light emitting device according to the second embodiment of the present disclosure.

FIGS. 12, 13, and 14 illustrate a semiconductor light emitting device according to a second embodiment of the present disclosure. FIG. 12 is a plan view of the semiconductor light emitting device, denoted by A2, according to the present embodiment. FIG. 13 is a bottom view of the semiconductor light emitting device A2. FIG. 14 is a left side view of the semiconductor light emitting device A2. Note that, in FIG. 12 and subsequent figures, elements identical or similar to corresponding elements of the semiconductor light emitting device A1 according to the above-described embodiment are denoted by the same reference symbols as those of the corresponding elements of the semiconductor light emitting device A1 according to the above-described embodiment, and redundant description will be omitted as appropriate. Also note that features of components of the embodiments described herein may be combined as appropriate as long as no technical conflict arises.

The semiconductor light emitting device A2 according to the present embodiment is different from the semiconductor light emitting device A1 according to the above-described embodiment primarily in the structures of the second portion 22 of the first electrode 2 and the fifth portion 32 of the second electrode 3. Moreover, the semiconductor light emitting device A2 additionally includes a first insulating film 71 and a second insulating film 72.

In the present embodiment, the dimension (i.e., the second dimension L2) of the second portion 22 measured in the second direction y is greater than that in the above-described embodiment. In addition, the dimension (i.e., the second dimension L2) of the second portion 22 measured in the second direction y is greater than the dimension (i.e., the first dimension L1) of the first portion 21 measured in the second direction y. In the example illustrated in FIG. 12, the dimension (i.e., the second dimension L2) of the second portion 22 measured in the second direction y is approximately 0.59 times the dimension (i.e., the third dimension L3) of the first principal surface 11 measured in the second direction y.

In the semiconductor light emitting device A2, the dimension (i.e., the fifth dimension L5) of the fifth portion 32 measured in the second direction y is greater than that in the above-described embodiment. The dimension (i.e., the fifth dimension L5) of the fifth portion 32 measured in the second direction y is greater than the dimension (i.e., the fourth dimension L4) of the fourth portion 31 measured in the second direction y. In the example illustrated in FIG. 12, the dimension (i.e., the fifth dimension L5) of the fifth portion 32 measured in the second direction y is approximately 0.59 times the dimension (i.e., the third dimension L3) of the first principal surface 11 measured in the second direction y.

As illustrated in FIGS. 13 and 14, the first insulating film 71 and the second insulating film 72 are disposed on the second principal surface 12. The specific structure of each of the first insulating film 71 and the second insulating film 72 is not limited in any manner, and each of the first insulating film 71 and the second insulating film 72 is formed by, for example, a resist layer.

The first insulating film 71 is formed on the third portion 23, and in the illustrated example, the first insulating film 71 is in the shape of a strip extending in the first direction x when viewed in the thickness direction z. The first insulating film 71 is formed in such a manner as to cover portions of both the third portion 23 and the second principal surface 12. The first insulating film 71 divides the third portion 23 into a portion on the first side y1 in the second direction and a portion on the second side y2 in the second direction when viewed in the thickness direction z. The first insulating film 71 is disposed close to the first side y1 in the second direction on the second principal surface 12. The dimension of the portion of the third portion 23, which is divided by the first insulating film 71 and which lies on the second side y2 in the second direction, measured in the second direction y is equal or substantially equal to the dimension (i.e., the second dimension L2) of the second portion 22 measured in the second direction y.

The second insulating film 72 is disposed on the second principal surface 12. The second insulating film 72 is formed on the sixth portion 33, and in the illustrated example, the second insulating film 72 is in the shape of a strip extending in the first direction x when viewed in the thickness direction z. The second insulating film 72 is formed in such a manner as to cover portions of both the sixth portion 33 and the second principal surface 12. The second insulating film 72 divides the sixth portion 33 into a portion on the first side y1 in the second direction and a portion on the second side y2 in the second direction when viewed in the thickness direction z. The second insulating film 72 is disposed close to the first side y1 in the second direction on the second principal surface 12. The dimension of the portion of the sixth portion 33, which is divided by the second insulating film 72 and which lies on the second side y2 in the second direction, measured in the second direction y is equal or substantially equal to the dimension (i.e., the fifth dimension L5) of the fifth portion 32 measured in the second direction y.

Figure 15:
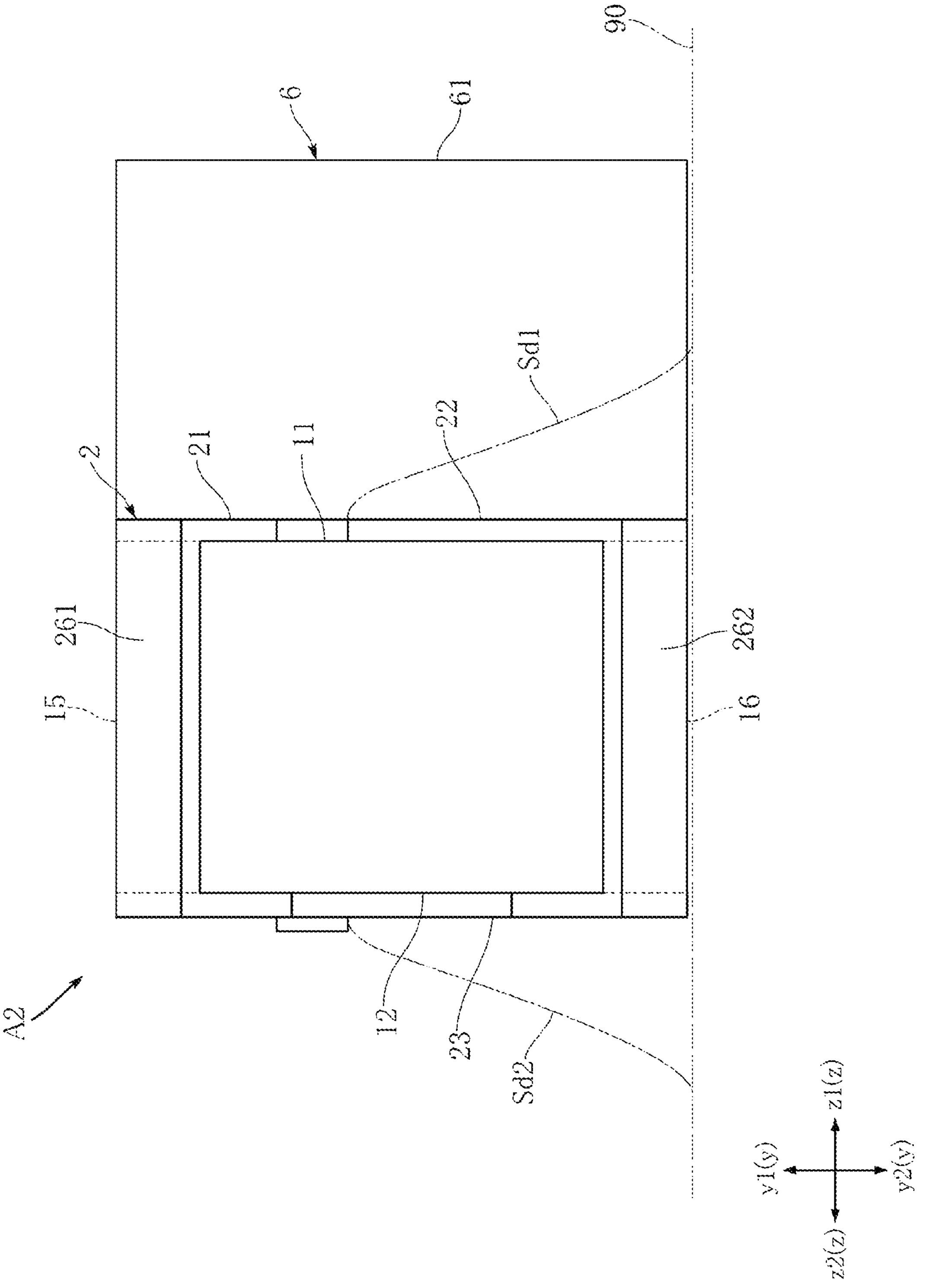
FIG. 15 is a left side view illustrating an example situation of mounting of the semiconductor light emitting device according to the second embodiment of the present disclosure.

FIG. 15 is a left side view illustrating an example situation in which the semiconductor light emitting device A2 is mounted on a mount board. The semiconductor light emitting device A2 is mounted on the mount board 90 (represented by a phantom line) with the side surface 16 (i.e., the surface that faces the second side y2 in the second direction) of the board 1 facing the mount board 90.

According to the present embodiment, when the semiconductor light emitting device A2 has been mounted on the mount board 90, the second portion 22 is apart from the first bonding portion 24 and the first portion 21 connected thereto, and this prevents a solder from reaching the first portion 21 or the first bonding portion 24 even if the solder intrudes into the semiconductor light emitting device A2 and travels along the second portion 22. Therefore, the configuration in which the first electrode 2 includes the first portion 21, the second portion 22, the third portion 23, and the first bonding portion 24 can prevent a trouble such as an unwanted electrical connection due to intrusion of the solder. In addition, the semiconductor light emitting device A2 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A2.

When the semiconductor light emitting device A2 has been mounted on the mount board 90, the fifth portion 32 is apart from the second bonding portion 34 and the fourth portion 31 connected thereto, and this prevents a solder from reaching the fourth portion 31 or the second bonding portion 34 even if the solder intrudes into the semiconductor light emitting device A2 and travels along the fifth portion 32. Therefore, the configuration in which the second electrode 3 includes the fourth portion 31, the fifth portion 32, the sixth portion 33, and the second bonding portion 34 can prevent a trouble such as an unwanted electrical connection due to intrusion of the solder. In addition, the semiconductor light emitting device A2 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A2.

The dimension (i.e., the second dimension L2) of the second portion 22 measured in the second direction y is greater than the dimension (i.e., the first dimension L1) of the first portion 21 measured in the second direction y. Each of the second portion 22 and the third portion 23 is joined to the mount board 90 through a solder. The solder joined to the second portion 22 is formed in a range corresponding to the second dimension L2 of the second portion 22 measured in the second direction y. The solder joined to the third portion 23 is formed on the portion of the third portion 23 which is divided by the first insulating film 71 and which lies on the second side y2 in the second direction (see FIG. 15). The above configuration contributes to minimizing a variation in size between the solder joined to the second portion 22 and the solder joined to the third portion 23. This, in turn, contributes to increasing strength and stability of the mounting of the semiconductor light emitting device A2.

The dimension (i.e., the fifth dimension L5) of the fifth portion 32 measured in the second direction y is greater than the dimension (i.e., the fourth dimension L4) of the fourth portion 31 measured in the second direction y. Each of the fifth portion 32 and the sixth portion 33 is joined to the mount board 90 through a solder. The solder joined to the fifth portion 32 is formed in a range corresponding to the fifth dimension L5 of the fifth portion 32 measured in the second direction y. The solder joined to the sixth portion 33 is formed on the portion of the sixth portion 33 which is divided by the second insulating film 72 and which lies on the second side y2 in the second direction. The above configuration contributes to minimizing a variation in size between the solder joined to the fifth portion 32 and the solder joined to the sixth portion 33. This, in turn, contributes to increasing the strength and stability of the mounting of the semiconductor light emitting device A2. Moreover, the semiconductor light emitting device A2 exhibits other advantageous effects exhibited by the semiconductor light emitting device A1 according to the above-described embodiment, due to features shared by the semiconductor light emitting device A1.

Third Embodiment

Figure 16:
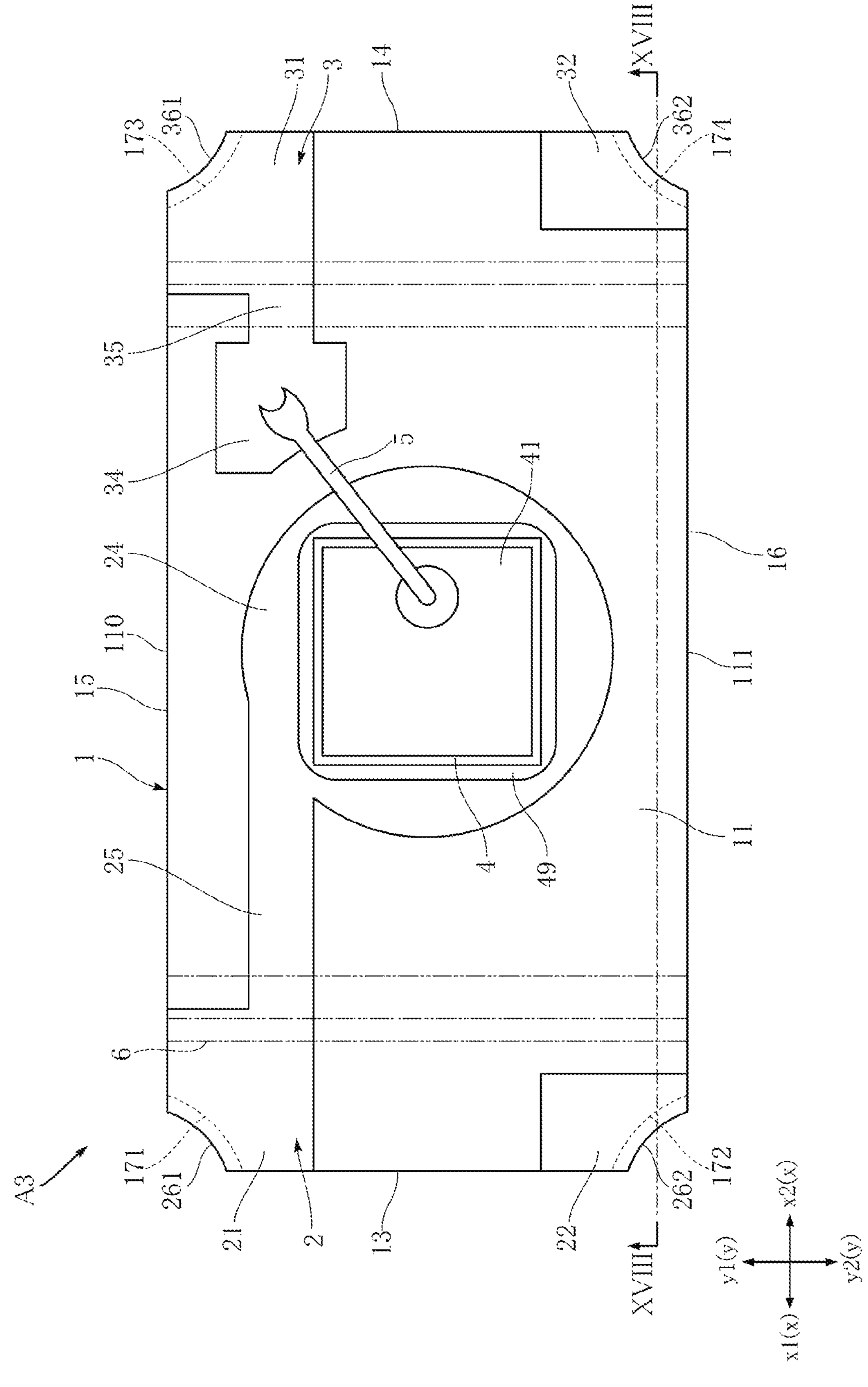
FIG. 16 is a plan view of a semiconductor light emitting device according to a third embodiment of the present disclosure.
Figure 17:
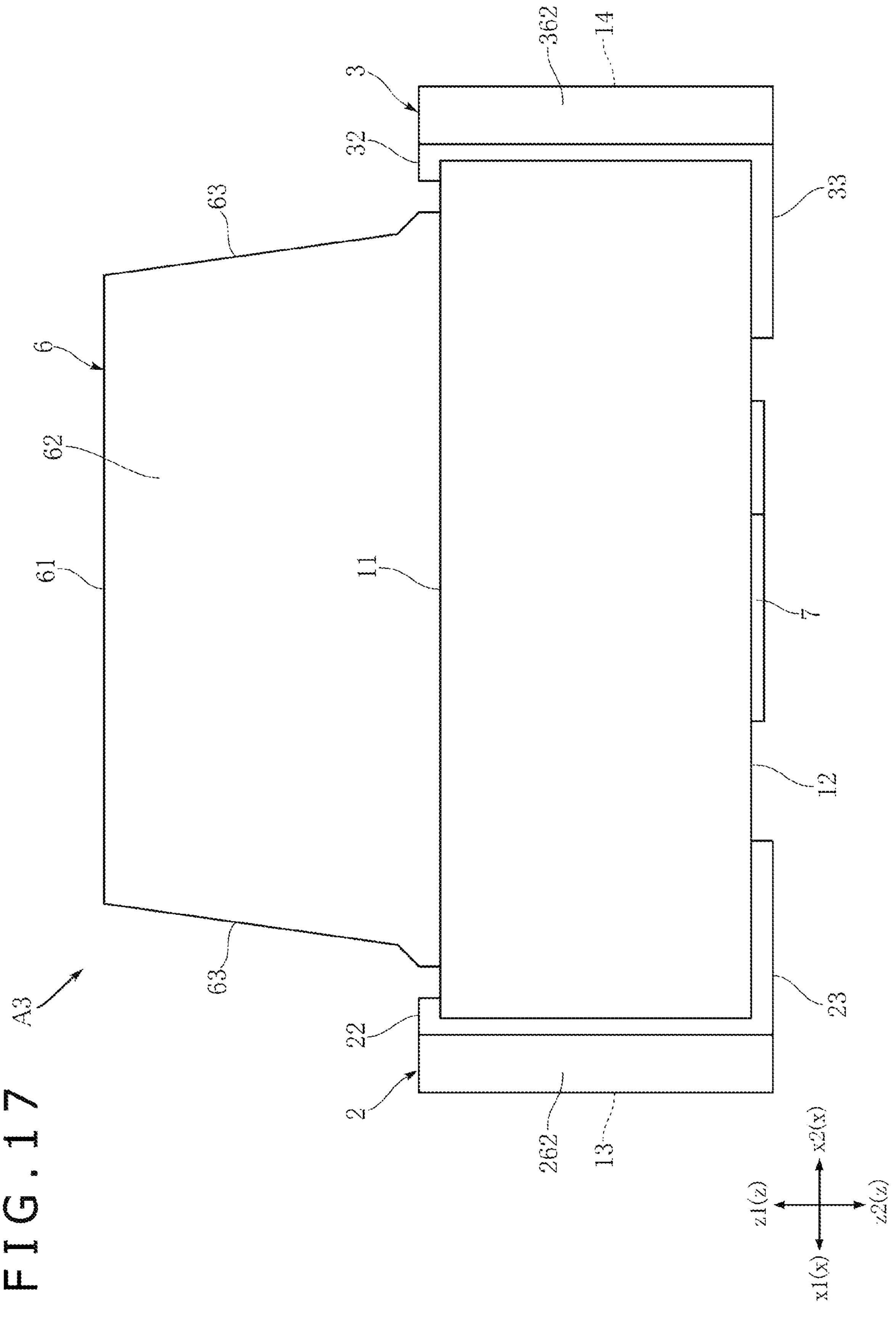
FIG. 17 is a front view of the semiconductor light emitting device according to the third embodiment of the present disclosure.
Figure 18:
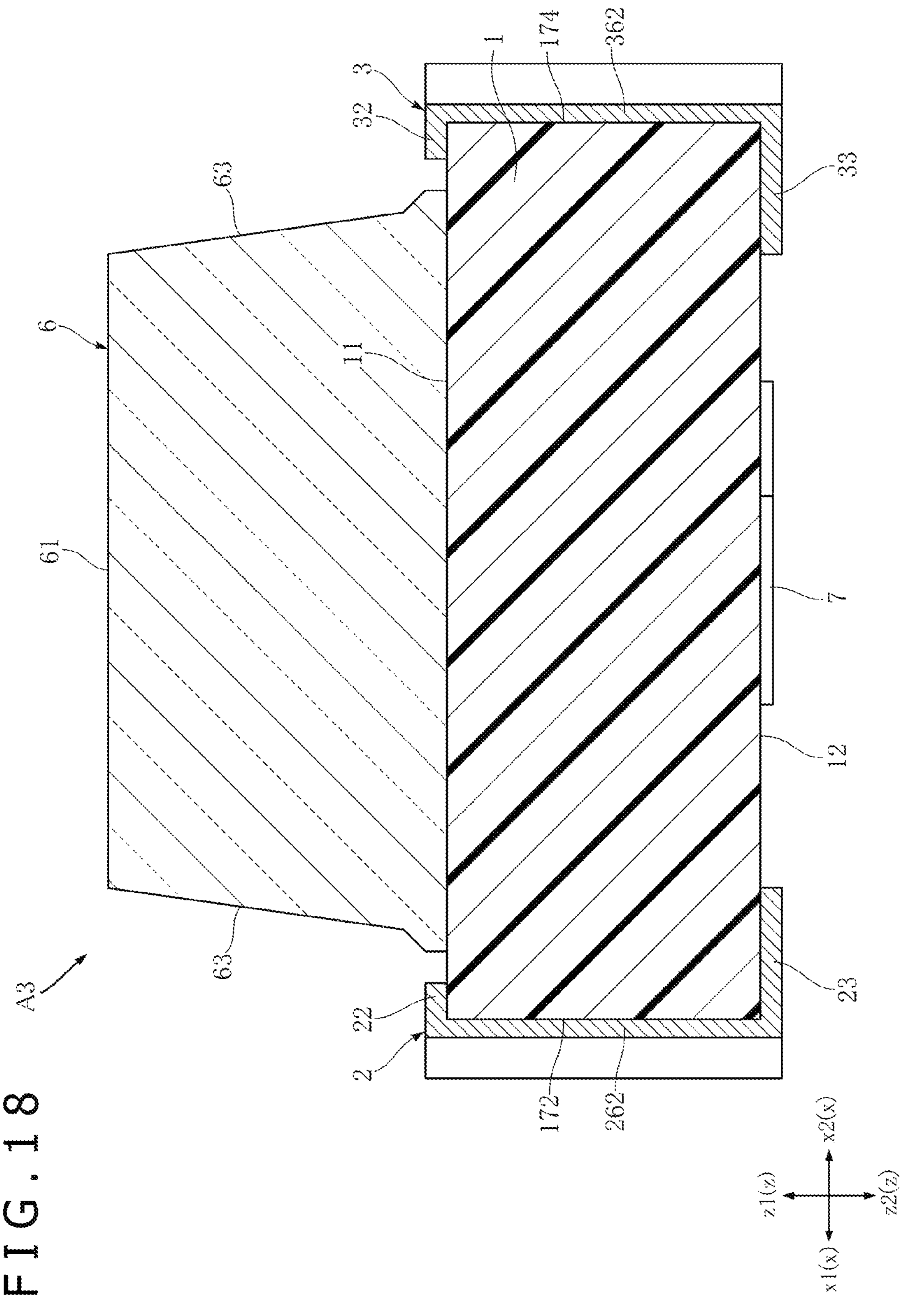
FIG. 18 is a sectional view of the semiconductor light emitting device taken along line XVIII-XVIII in FIG. 16.

FIGS. 16, 17, and 18 illustrate a semiconductor light emitting device according to a third embodiment of the present disclosure. FIG. 16 is a plan view of the semiconductor light emitting device, denoted by A3, according to the present embodiment. FIG. 17 is a front view of the semiconductor light emitting device A3. FIG. 18 is a sectional view of the semiconductor light emitting device A3 taken along line XVIII-XVIII in FIG. 16.

The semiconductor light emitting device A3 according to the present embodiment is different from the semiconductor light emitting device A1 according to the above-described first embodiment primarily in the structures of the second portion 22 of the first electrode 2 and the fifth portion 32 of the second electrode 3. In the present embodiment, the dimension of each of the second portion 22 and the fifth portion 32 measured in the first direction x is smaller than that in the above-described first embodiment. An edge of the second portion 22 which lies on the second side x2 in the first direction is positioned closer to the first side x1 in the first direction than in the above-described first embodiment. An edge of the fifth portion 32 which lies on the first side x1 in the first direction is positioned closer to the second side x2 in the first direction than in the above-described first embodiment. Thus, each of the second portion 22 and the fifth portion 32 is not covered with the light-transmitting resin 6.

When the semiconductor light emitting device A3 having the above-described structure has been mounted on a mount board, a solder joined to the second portion 22 (or the fifth portion 32) is prevented from traveling along the second portion 22 (or the fifth portion 32) and intruding into the semiconductor light emitting device A3. Thus, a trouble due to intrusion of the solder can be prevented. In addition, the semiconductor light emitting device A3 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A3. Moreover, the semiconductor light emitting device A3 exhibits other advantageous effects exhibited by the semiconductor light emitting device A1 according to the above-described first embodiment, due to features shared by the semiconductor light emitting device A1.

Fourth Embodiment

Figure 19:
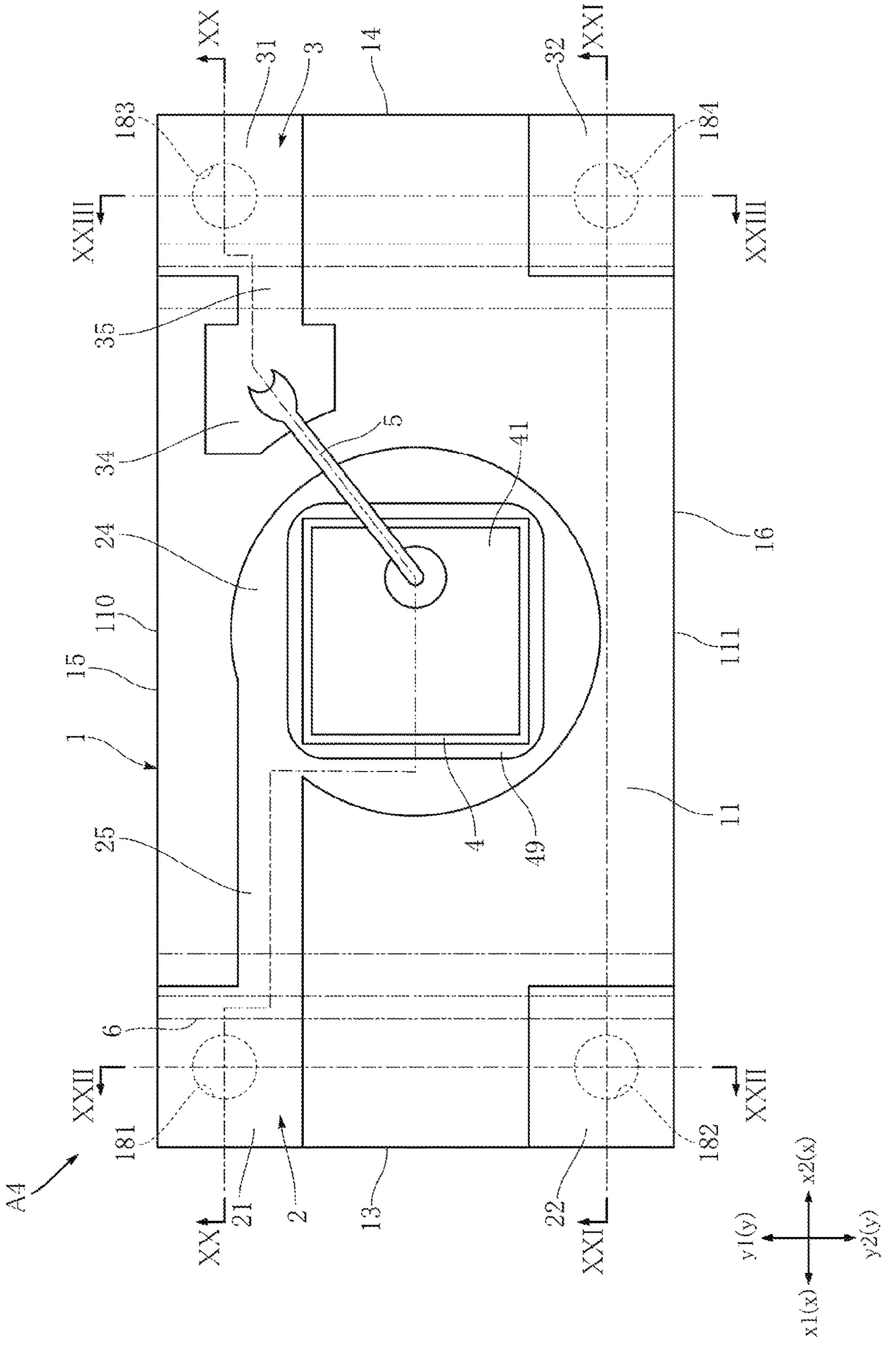
FIG. 19 is a plan view of a semiconductor light emitting device according to a fourth embodiment of the present disclosure.
Figure 20:
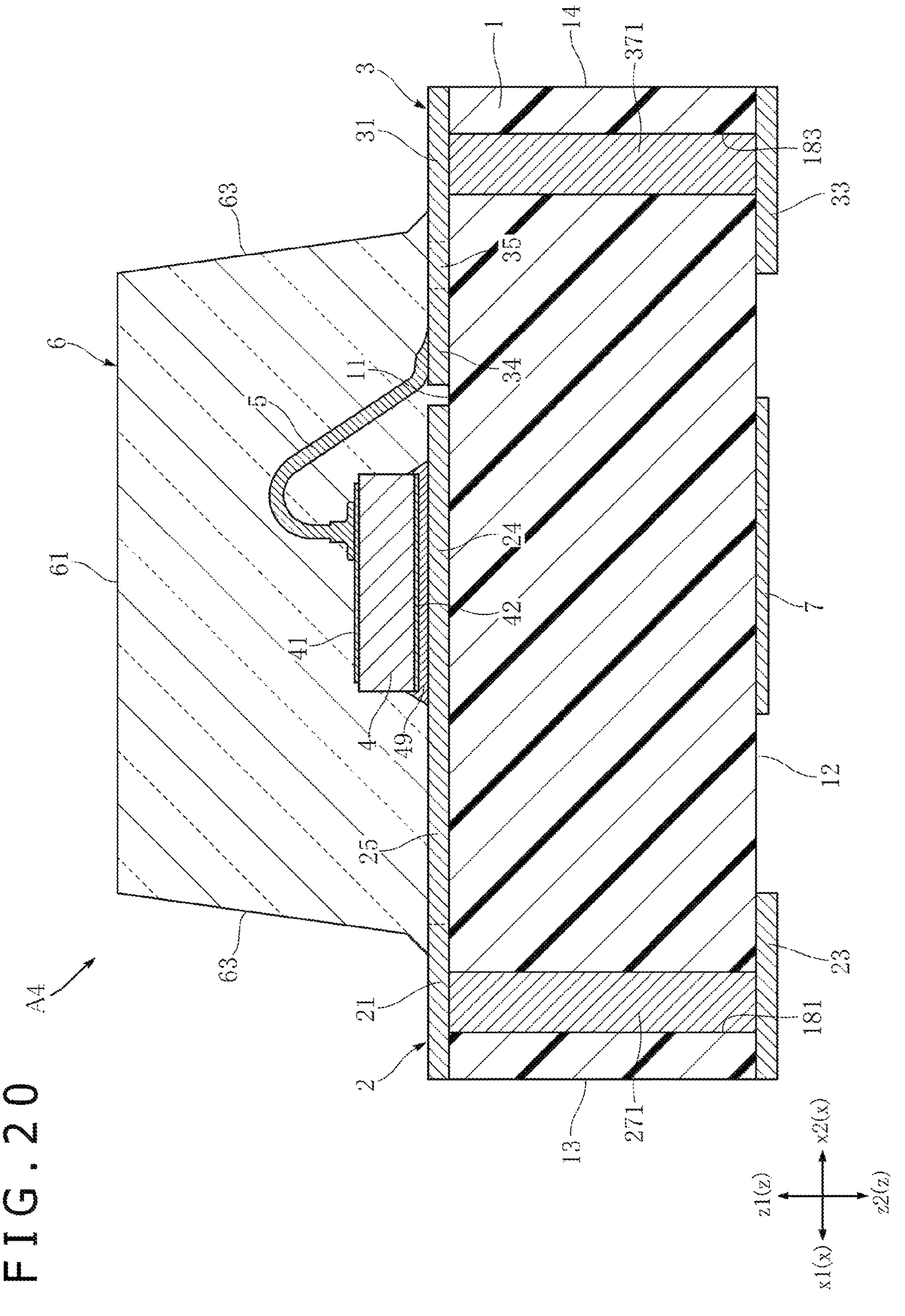
FIG. 20 is a sectional view of the semiconductor light emitting device taken along line XX-XX in FIG. 19.
Figure 21:
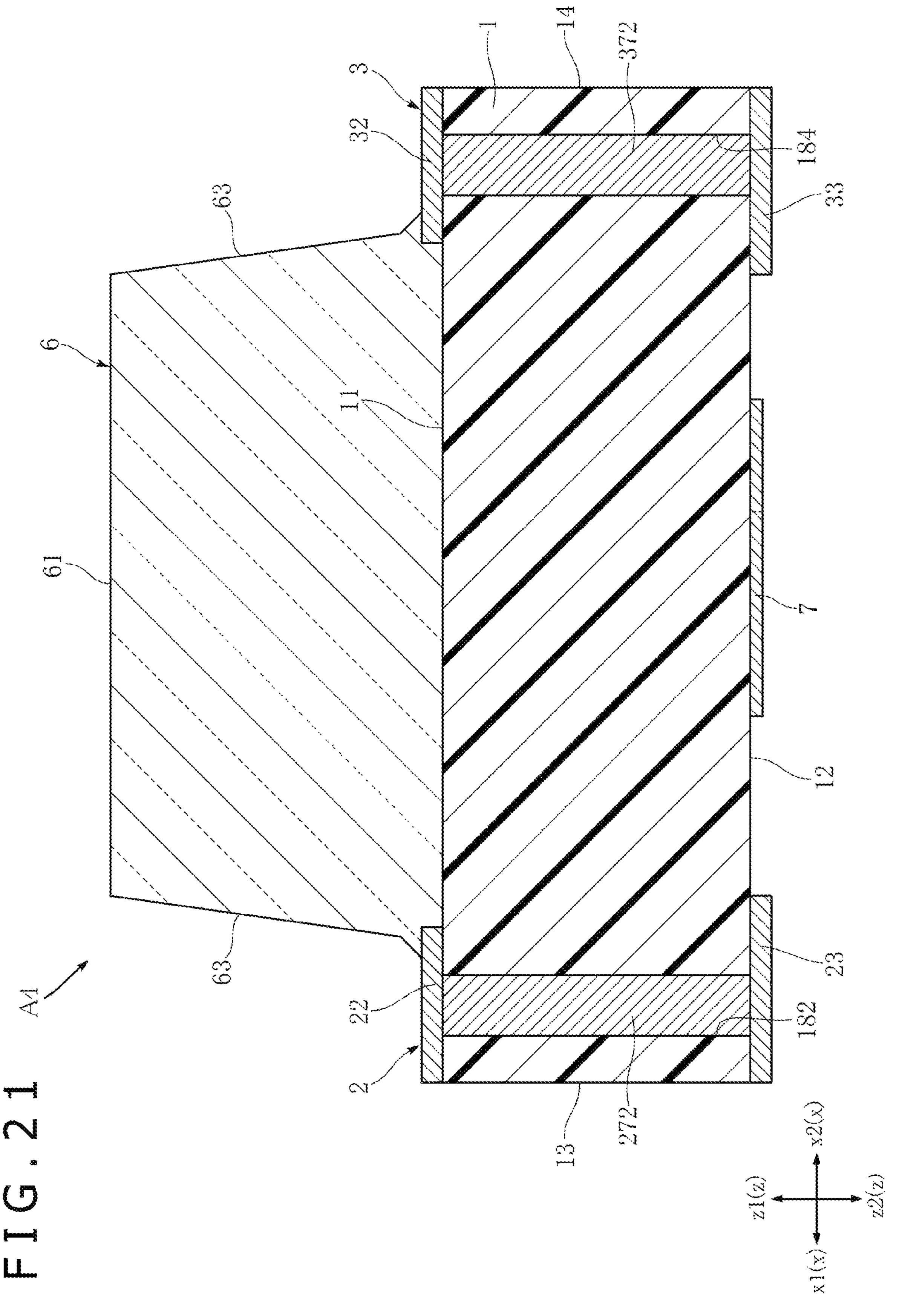
FIG. 21 is a sectional view of the semiconductor light emitting device taken along line XXI-XXI in FIG. 19.
Figure 22:
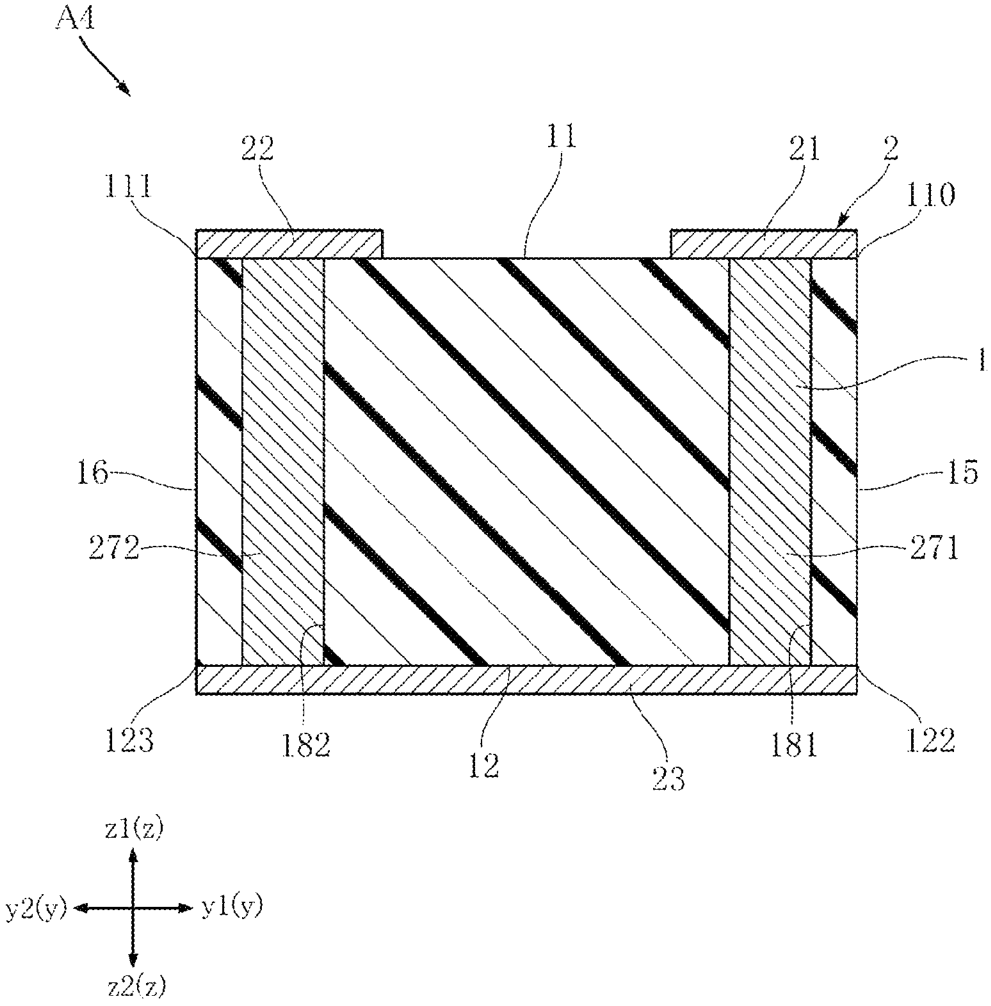
FIG. 22 is a sectional view of the semiconductor light emitting device taken along line XXII-XXII in FIG. 19.
Figure 23:
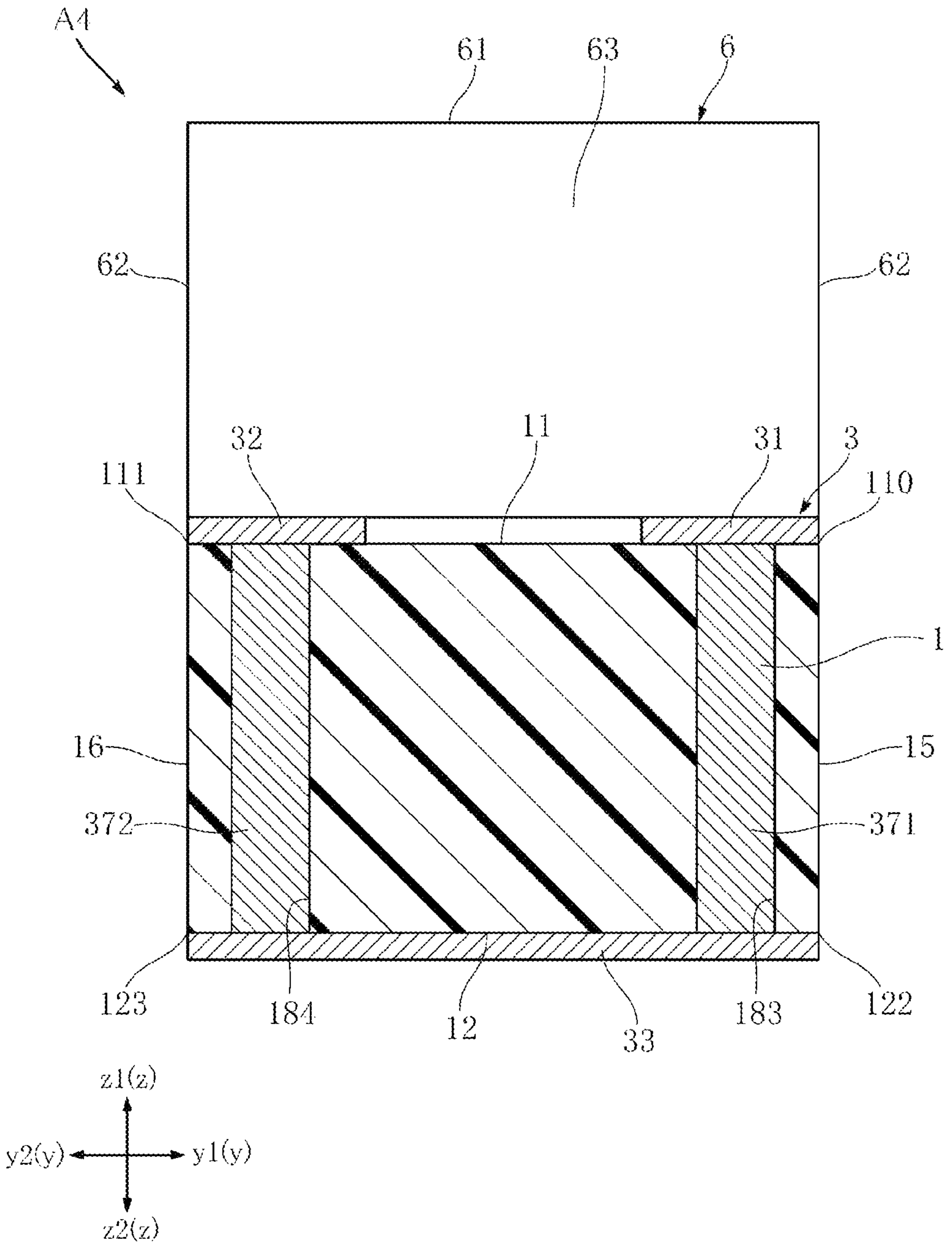
FIG. 23 is a sectional view of the semiconductor light emitting device taken along line XXIII-XXIII in FIG. 19.

FIGS. 19, 20, 21, 22, and 23 illustrate a semiconductor light emitting device according to a fourth embodiment of the present disclosure. FIG. 19 is a plan view of the semiconductor light emitting device, denoted by A4, according to the present embodiment. FIG. 20 is a sectional view of the semiconductor light emitting device A4 taken along line XX-XX in FIG. 19. FIG. 21 is a sectional view of the semiconductor light emitting device A4 taken along line XXI-XXI in FIG. 19. FIG. 22 is a sectional view of the semiconductor light emitting device A4 taken along line XXII-XXII in FIG. 19. FIG. 23 is a sectional view of the semiconductor light emitting device A4 taken along line XXIII-XXIII in FIG. 19.

The semiconductor light emitting device A4 according to the present embodiment is different from the semiconductor light emitting device A1 according to the above-described first embodiment primarily in the structures of the board 1, the first electrode 2, and the second electrode 3. In the present embodiment, the recessed grooves 171 to 174 are not provided at the four corners of the board 1. Instead, the board 1 includes through holes 181, 182, 183, and 184. Each of the through holes 181 to 184 penetrates the board 1 in the thickness direction z. The through hole 181 overlaps each of the first portion 21 and the third portion 23 when viewed in the thickness direction z. The through hole 182 overlaps each of the second portion 22 and the third portion 23 when viewed in the thickness direction z. The through hole 183 overlaps each of the fourth portion 31 and the sixth portion 33 when viewed in the thickness direction z. The through hole 184 overlaps each of the fifth portion 32 and the sixth portion 33 when viewed in the thickness direction z.

In the present embodiment, the first electrode 2 does not include the groove junction portions 261 and 262, but instead includes electrically conductive through portions 271 and 272. The electrically conductive through portion 271 is loaded in the through hole 181. The electrically conductive through portion 271 is connected to both the first portion 21 and the third portion 23. The electrically conductive through portion 271 overlaps the first principal surface 11 when viewed in the thickness direction z and is positioned between the first principal surface 11 and the second principal surface 12 in the thickness direction z. The electrically conductive through portion 272 is loaded in the through hole 182. The electrically conductive through portion 272 is connected to both the second portion 22 and the third portion 23. The electrically conductive through portion 272 overlaps the first principal surface 11 when viewed in the thickness direction z and is positioned between the first principal surface 11 and the second principal surface 12 in the thickness direction z. The above configuration causes the first portion 21 and the second portion 22 to be electrically continuous with each other through the third portion 23 and the electrically conductive through portions 271 and 272. Each of the electrically conductive through portions 271 and 272 is an example of a portion of the third portion of the present disclosure.

In the present embodiment, the second electrode 3 does not include the groove junction portions 361 and 362, but instead includes electrically conductive through portions 371 and 372. The electrically conductive through portion 371 is loaded in the through hole 183. The electrically conductive through portion 371 is connected to both the fourth portion 31 and the sixth portion 33. The electrically conductive through portion 371 overlaps the first principal surface 11 when viewed in the thickness direction z and is positioned between the first principal surface 11 and the second principal surface 12 in the thickness direction z. The electrically conductive through portion 372 is loaded in the through hole 184. The electrically conductive through portion 372 is connected to both the fifth portion 32 and the sixth portion 33. The electrically conductive through portion 372 overlaps the first principal surface 11 when viewed in the thickness direction z and is positioned between the first principal surface 11 and the second principal surface 12 in the thickness direction z. The above configuration causes the fourth portion 31 and the fifth portion 32 to be electrically continuous with each other through the sixth portion 33 and the electrically conductive through portions 371 and 372. Each of the electrically conductive through portions 371 and 372 is an example of a portion of the sixth portion of the present disclosure.

According to the present embodiment, when the semiconductor light emitting device A4 has been mounted on a mount board, the second portion 22 is apart from the first bonding portion 24 and the first portion 21 connected thereto, and this prevents a solder from reaching the first portion 21 or the first bonding portion 24 even if the solder intrudes into the semiconductor light emitting device A4 and travels along the second portion 22. Therefore, the configuration in which the first electrode 2 includes the first portion 21, the second portion 22, the third portion 23, and the first bonding portion 24 can prevent a trouble such as an unwanted electrical connection due to intrusion of the solder. In addition, the semiconductor light emitting device A4 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A4.

When the semiconductor light emitting device A4 has been mounted on the mount board, the fifth portion 32 is apart from the second bonding portion 34 and the fourth portion 31 connected thereto, and this prevents a solder from reaching the fourth portion 31 or the second bonding portion 34 even if the solder intrudes into the semiconductor light emitting device A4 and travels along the fifth portion 32. Therefore, the configuration in which the second electrode 3 includes the fourth portion 31, the fifth portion 32, the sixth portion 33, and the second bonding portion 34 can prevent a trouble such as an unwanted electrical connection due to intrusion of the solder. In addition, the semiconductor light emitting device A4 does not require formation of an insulating film on the first principal surface 11, which would be required in the case where, unlike in the present embodiment, an insulating film is interposed between the electrode and the light-transmitting resin, for example. This is desirable for reducing the size of the semiconductor light emitting device A4. Moreover, the semiconductor light emitting device A4 exhibits other advantageous effects exhibited by the semiconductor light emitting device A1 according to the above-described first embodiment, due to features shared by the semiconductor light emitting device A1.

Semiconductor light emitting devices according to the present disclosure are not limited to the semiconductor light emitting devices according to the above-described embodiments. Various design changes may be made in the specific structures of portions of the semiconductor light emitting devices according to the embodiments of the present disclosure.

The present disclosure includes the configurations as set forth in the following appendixes.

(Appendix 1)

A semiconductor light emitting device including:

a board including a first principal surface facing a first side in a thickness direction thereof and a second principal surface facing a second side in the thickness direction;

a first electrode provided on the board;

a semiconductor light emitting element mounted on the first principal surface; and a light-transmitting resin that covers the semiconductor light emitting element, in which the first electrode includes a first bonding portion, a first portion, a second portion, and a third portion, the first bonding portion is formed on the first principal surface and is joined and electrically connected to the semiconductor light emitting element, each of the first portion and the second portion is formed on the first principal surface and is disposed on a first side in a first direction perpendicular to the thickness direction on the board, the first portion is connected to the first bonding portion on the first principal surface, the second portion is apart from the first bonding portion on the first principal surface and is apart from the first portion in a second direction perpendicular to both the thickness direction and the first direction, the third portion is formed on a place different from the first principal surface, and the first portion and the second portion are electrically continuous with each other through the third portion.

(Appendix 2)

The semiconductor light emitting device according to appendix 1, in which the first portion is positioned on a first side in the second direction on the first principal surface, and the second portion is positioned on a second side in the second direction on the first principal surface.

(Appendix 3)

The semiconductor light emitting device according to appendix 2, in which the first electrode includes a first connection portion connected to both the first bonding portion and the first portion, and the first connection portion is positioned close to the first side in the second direction on the first principal surface.

(Appendix 4)

The semiconductor light emitting device according to appendix 2 or 3, in which the first principal surface includes a first edge positioned on the second side in the second direction, and the second portion adjoins the first edge.

(Appendix 5)

The semiconductor light emitting device according to appendix 4, in which a second dimension is equal to or greater than a first dimension, the second dimension being a dimension of the second portion measured in the second direction, the first dimension being a dimension of the first portion measured in the second direction.

(Appendix 6)

The semiconductor light emitting device according to appendix 4 or 5, in which the dimension of the second portion measured in the second direction is in a range of 0.1 to 0.8 times a dimension of the first principal surface measured in the second direction.

(Appendix 7)

The semiconductor light emitting device according to any one of appendixes 1 to 6, in which the third portion is formed on the second principal surface.

(Appendix 8)

The semiconductor light emitting device according to appendix 7, in which the second principal surface includes a second edge positioned on the first side in the second direction, and a third edge positioned on the second side in the second direction, and the third portion adjoins both the second edge and the third edge.

(Appendix 9)

The semiconductor light emitting device according to appendix 7 or 8, further including:

a first insulating film formed on the third portion, in which the first insulating film divides the third portion into a portion on the first side in the second direction and a portion on the second side in the second direction when viewed in the thickness direction.

(Appendix 10)

The semiconductor light emitting device according to any one of appendixes 1 to 6, in which the third portion overlaps the first principal surface when viewed in the thickness direction, and is positioned between the first principal surface and the second principal surface in the thickness direction.

(Appendix 11)

The semiconductor light emitting device according to any one of appendixes 1 to 10, in which the second portion is not covered with the light-transmitting resin.

(Appendix 12)

The semiconductor light emitting device according to any one of appendixes 1 to 11, further including:

a second electrode provided on the board, in which the second electrode includes a second bonding portion, a fourth portion, a fifth portion, and a sixth portion, the second bonding portion is formed on the first principal surface and is joined and electrically connected to the semiconductor light emitting element, each of the fourth portion and the fifth portion is formed on the first principal surface and is disposed on a second side in the first direction on the board, the fourth portion is connected to the second bonding portion on the first principal surface, the fifth portion is apart from the second bonding portion on the first principal surface and is apart from the fourth portion in the second direction, the sixth portion is formed on a place different from the first principal surface, and the fourth portion and the fifth portion are electrically continuous with each other through the sixth portion.

(Appendix 13)

The semiconductor light emitting device according to appendix 12, in which the fourth portion is positioned on the first side in the second direction on the first principal surface, and the fifth portion is positioned on the second side in the second direction on the first principal surface.

(Appendix 14)

The semiconductor light emitting device according to appendix 13, in which the first principal surface includes the first edge positioned on the second side in the second direction, and the fifth portion adjoins the first edge.

(Appendix 15)

The semiconductor light emitting device according to appendix 14, in which a fifth dimension is equal to or greater than a fourth dimension, the fifth dimension being a dimension of the fifth portion measured in the second direction, the fourth dimension being a dimension of the fourth portion measured in the second direction.

(Appendix 16)

The semiconductor light emitting device according to appendix 14 or 15, in which the dimension of the fifth portion measured in the second direction is in a range of 0.1 to 0.8 times the dimension of the first principal surface measured in the second direction.

(Appendix 17)

The semiconductor light emitting device according to any one of appendixes 12 to 16, in which the sixth portion is formed on the second principal surface.

(Appendix 18)

The semiconductor light emitting device according to appendix 17, in which the second principal surface includes the second edge positioned on the first side in the second direction and the third edge positioned on the second side in the second direction, and the sixth portion adjoins both the second edge and the third edge.

(Appendix 19)

The semiconductor light emitting device according to appendix 17 or 18, further including:

a second insulating film formed on the sixth portion, in which the second insulating film divides the sixth portion into a portion on the first side in the second direction and a portion on the second side in the second direction when viewed in the thickness direction.

(Appendix 20)

The semiconductor light emitting device according to any one of appendixes 12 to 16, in which the sixth portion overlaps the first principal surface when viewed in the thickness direction, and is positioned between the first principal surface and the second principal surface in the thickness direction.

(Appendix 21)

The semiconductor light emitting device according to any one of appendixes 12 to 20, in which the fifth portion is not covered with the light-transmitting resin.

(Appendix 22)

The semiconductor light emitting device according to any one of appendixes 1 to 21, in which the semiconductor light emitting element is disposed on the first bonding portion.

What is claimed is:

1. A semiconductor light emitting device comprising:

a board including a first principal surface facing a first side in a thickness direction thereof and a second principal surface facing a second side in the thickness direction;

a first electrode provided on the board;

a semiconductor light emitting element mounted on the first principal surface; and a light-transmitting resin that covers the semiconductor light emitting element, wherein the first electrode includes a first bonding portion, a first portion, a second portion, and a third portion, the first bonding portion is formed on the first principal surface and is joined and electrically connected to the semiconductor light emitting element, each of the first portion and the second portion is formed on the first principal surface and is disposed on a first side in a first direction perpendicular to the thickness direction on the board, the first portion is connected to the first bonding portion on the first principal surface, the second portion is apart from the first bonding portion on the first principal surface and is apart from the first portion in a second direction perpendicular to both the thickness direction and the first direction, the third portion is formed on a place different from the first principal surface, and the first portion and the second portion are electrically continuous with each other through the third portion.

2. The semiconductor light emitting device according to claim 1, wherein the first portion is positioned on a first side in the second direction on the first principal surface, and the second portion is positioned on a second side in the second direction on the first principal surface.

3. The semiconductor light emitting device according to claim 2, wherein the first electrode includes a first connection portion connected to both the first bonding portion and the first portion, and the first connection portion is positioned close to the first side in the second direction on the first principal surface.

4. The semiconductor light emitting device according to claim 2, wherein the first principal surface includes a first edge positioned on the second side in the second direction, and the second portion adjoins the first edge.

5. The semiconductor light emitting device according to claim 4, wherein a second dimension is equal to or greater than a first dimension, the second dimension being a dimension of the second portion measured in the second direction, the first dimension being a dimension of the first portion measured in the second direction.

6. The semiconductor light emitting device according to claim 4, wherein a dimension of the second portion measured in the second direction is in a range of 0.1 to 0.8 times a dimension of the first principal surface measured in the second direction.

7. The semiconductor light emitting device according to claim 1, wherein the third portion is formed on the second principal surface.

8. The semiconductor light emitting device according to claim 7, wherein the second principal surface includes a second edge positioned on a first side in the second direction, and a third edge positioned on a second side in the second direction, and the third portion adjoins both the second edge and the third edge.

9. The semiconductor light emitting device according to claim 7, further comprising:

a first insulating film formed on the third portion, wherein the first insulating film divides the third portion into a portion on a first side in the second direction and a portion on a second side in the second direction when viewed in the thickness direction.

10. The semiconductor light emitting device according to claim 1, wherein the third portion overlaps the first principal surface when viewed in the thickness direction, and is positioned between the first principal surface and the second principal surface in the thickness direction.

11. The semiconductor light emitting device according to claim 1, wherein the second portion is not covered with the light-transmitting resin.

12. The semiconductor light emitting device according to claim 1, further comprising:

a second electrode provided on the board, wherein the second electrode includes a second bonding portion, a fourth portion, a fifth portion, and a sixth portion, the second bonding portion is formed on the first principal surface and is joined and electrically connected to the semiconductor light emitting element, each of the fourth portion and the fifth portion is formed on the first principal surface and is disposed on a second side in the first direction on the board, the fourth portion is connected to the second bonding portion on the first principal surface, the fifth portion is apart from the second bonding portion on the first principal surface and is apart from the fourth portion in the second direction, the sixth portion is formed on a place different from the first principal surface, and the fourth portion and the fifth portion are electrically continuous with each other through the sixth portion.

13. The semiconductor light emitting device according to claim 12, wherein the fourth portion is positioned on a first side in the second direction on the first principal surface, and the fifth portion is positioned on a second side in the second direction on the first principal surface.

14. The semiconductor light emitting device according to claim 13, wherein the first principal surface includes a first edge positioned on the second side in the second direction, and the fifth portion adjoins the first edge.

15. The semiconductor light emitting device according to claim 14, wherein a fifth dimension is equal to or greater than a fourth dimension, the fifth dimension being a dimension of the fifth portion measured in the second direction, the fourth dimension being a dimension of the fourth portion measured in the second direction.

16. The semiconductor light emitting device according to claim 14, wherein a dimension of the fifth portion measured in the second direction is in a range of 0.1 to 0.8 times a dimension of the first principal surface measured in the second direction.

17. The semiconductor light emitting device according to claim 12, wherein the sixth portion is formed on the second principal surface.

18. The semiconductor light emitting device according to claim 17, wherein the second principal surface includes a second edge positioned on a first side in the second direction and a third edge positioned on a second side in the second direction, and the sixth portion adjoins both the second edge and the third edge.

19. The semiconductor light emitting device according to claim 17, further comprising:

a second insulating film formed on the sixth portion, wherein the second insulating film divides the sixth portion into a portion on a first side in the second direction and a portion on a second side in the second direction when viewed in the thickness direction.

20. The semiconductor light emitting device according to claim 12, wherein the sixth portion overlaps the first principal surface when viewed in the thickness direction, and is positioned between the first principal surface and the second principal surface in the thickness direction.

21. The semiconductor light emitting device according to claim 12, wherein the fifth portion is not covered with the light-transmitting resin.

22. The semiconductor light emitting device according to claim 1, wherein the semiconductor light emitting element is disposed on the first bonding portion.

* * * * *